(12) United States Patent
Takamine

(10) Patent No.: US 10,530,336 B2
(45) Date of Patent: Jan. 7, 2020

(54) ELASTIC WAVE FILTER, MULTIPLEXER, DUPLEXER, HIGH-FREQUENCY FRONT END CIRCUIT, AND COMMUNICATION DEVICE

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 86 days.

(21) Appl. No.: 15/846,256

(22) Filed: Dec. 19, 2017

(65) Prior Publication Data

US 2018/0123565 A1  May 3, 2018

Related U.S. Application Data

(63) Continuation of application No. PCT/JP2016/068688, filed on Jun. 23, 2016.

(30) Foreign Application Priority Data

Jun. 24, 2015 (JP) .................. 2015-127088

(51) Int. Cl.
*H03H 9/72* (2006.01)
*H03H 9/64* (2006.01)
(Continued)

(52) U.S. Cl.
CPC ............ *H03H 9/725* (2013.01); *H03H 9/145* (2013.01); *H03H 9/25* (2013.01); *H03H 9/6483* (2013.01)

(58) Field of Classification Search
CPC .................................................. H03H 9/46–76
See application file for complete search history.

(56) References Cited

U.S. PATENT DOCUMENTS 5,559,481 A    9/1996  Satoh et al.
7,501,912 B2 * 3/2009  Jamneala ............. H03H 9/0004
                                                333/132
(Continued)

FOREIGN PATENT DOCUMENTS

JP    05-183380 A    7/1993
JP    09-167937 A    6/1997
(Continued)

OTHER PUBLICATIONS

Official Communication issued in International Patent Application No. PCT/JP2016/068688, dated Sep. 13, 2016 and Sep. 27, 2016.

*Primary Examiner* — Dean O Takaoka
*Assistant Examiner* — Alan Wong
(74) *Attorney, Agent, or Firm* — Keating & Bennett, LLP

(57) ABSTRACT

A transmission filter includes five series resonators that include functional electrodes provided on a piezoelectric substrate, and connected in series with each other between a transmission input terminal and an antenna terminal, and parallel resonators. Frequency differences between the anti-resonant frequencies and the resonant frequencies of the series resonators other than the series resonator connected so as to be closest to the transmission input terminal and the series resonator connected so as to be closest to the antenna terminal are smaller than frequency differences of the series resonators, and anti-resonant frequencies of the series resonators are lower than the anti-resonant frequencies of the series resonators.

18 Claims, 16 Drawing Sheets

(51) Int. Cl.
*H03H 9/145* (2006.01)
*H03H 9/25* (2006.01)

(56) References Cited

U.S. PATENT DOCUMENTS

| | | | | |
|---|---|---|---|---|
| 7,586,389 | B2* | 9/2009 | Ali-Ahmad | H03H 9/54 |
| | | | | 333/133 |
| 8,179,207 | B2* | 5/2012 | Tanaka | H03H 9/0085 |
| | | | | 333/133 |
| 8,350,643 | B2* | 1/2013 | Inoue | H03H 7/42 |
| | | | | 333/132 |
| 8,847,700 | B2* | 9/2014 | Hara | H03H 9/0576 |
| | | | | 333/133 |
| 9,419,585 | B2* | 8/2016 | Yasuda | H03H 9/542 |
| 9,431,996 | B2* | 8/2016 | Watanabe | H03H 9/0222 |
| 9,685,930 | B2* | 6/2017 | Bauer | H03H 9/542 |
| 2008/0150652 | A1 | 6/2008 | Itou | |
| 2008/0309433 | A1 | 12/2008 | Shibahara et al. | |
| 2011/0227807 | A1 | 9/2011 | Iwaki et al. | |
| 2012/0032753 | A1 | 2/2012 | Nishimura et al. | |
| 2013/0285768 | A1* | 10/2013 | Watanabe | H03H 9/0222 |
| | | | | 333/193 |
| 2015/0349748 | A1 | 12/2015 | Bauer et al. | |

FOREIGN PATENT DOCUMENTS

| | | |
|---|---|---|
| JP | 2008-160562 A | 7/2008 |
| JP | 2013-168996 A | 8/2013 |
| KR | 10-0763763 B1 | 10/2007 |
| KR | 10-2008-0059530 A | 6/2008 |
| KR | 10-2011-0091882 A | 8/2011 |
| KR | 10-2013-0086378 A | 8/2013 |
| WO | 2010/061477 A1 | 6/2010 |
| WO | 2012/114593 A1 | 8/2012 |
| WO | 2014/108254 A1 | 7/2014 |

* cited by examiner

ELASTIC WAVE FILTER, MULTIPLEXER, DUPLEXER, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2015-127088 filed on Jun. 24, 2015 and is a Continuation Application of PCT Application No. PCT/JP2016/068688 filed on Jun. 23, 2016. The entire contents of each application are hereby incorporated herein by reference.

BACKGROUND OF THE INVENTION

1. Field of the Invention

The present invention relates to an elastic wave filter, a multiplexer, a duplexer, a high-frequency front end circuit, and a communication device.

2. Description of the Related Art

From the viewpoint of effectively utilizing frequency resources for wireless communication, various frequency bands are allocated as the communication bands of cellular phone devices and the like. In order to handle this situation, elastic wave filters that support various frequency specifications have been designed, developed and put into practical use as bandpass filters used in radio frequency (RF) circuits of communication devices and the like.

Japanese Unexamined Patent Application Publication No. 5-183380 discloses a ladder surface acoustic wave device that is able to be applied to high frequency bands and wide bandwidths. Specifically, the surface acoustic wave device includes a parallel resonator having a prescribed resonant frequency, a series resonator having a resonant frequency that substantially matches an anti-resonant frequency of the parallel resonator, and an inductance that is connected in series with the parallel resonator. The surface acoustic wave device defines a band pass filter. The parallel resonator and the series resonator are defined by interdigital transducer (IDT) electrodes provided on a piezoelectric substrate. According to the surface acoustic wave device disclosed in Japanese Unexamined Patent Application Publication No. 5-183380, by adding the inductance in series with the parallel resonator, the difference between the resonant frequency and the anti-resonant frequency of the resonator is able to be increased and the bandwidth of the band pass filter is able to be increased.

In order to support various frequency specifications as described above, in recent years, antenna duplexers that use surface acoustic wave devices, multiplexers that split high-frequency signals, and so forth have been put into practical use.

However, when attempts have been made to apply surface acoustic wave filters to recent frequency standards that have wide bandwidths and narrow intervals between adjacent bands, it has been difficult to sufficiently satisfy the required specifications, such as pass band insertion loss, suppression of adjacent bands, isolation of bands from each other, impedance and so forth using the ladder design technique of the related art disclosed in Japanese Unexamined Patent Application Publication No. 5-183380. Here, for example, Band 25 (transmission pass band: 1850-1915 MHz, reception pass band: 1930-1995 MHz) of the long term evolution (LTE) standard is used as an example. When an antenna duplexer or multiplexer using a surface acoustic wave device is applied to a frequency standard having wide band widths (65 MHz) and a narrow interval between the transmission and reception bands (15 MHz) such as in the case of Band 25, there is a problem in that steepness cannot be obtained in the bandpass characteristic outside a pass band while maintaining the desired impedance when using the surface acoustic wave device design technique of the related art.

SUMMARY OF THE INVENTION

Preferred embodiments of the present invention provide elastic wave filters, multiplexers, duplexers, high-frequency front end circuits, and communication devices that have high steepness in a bandpass characteristic outside a pass band while maintaining a desired impedance inside the passband.

An elastic wave filter according to a preferred embodiment of the present invention includes four or more series resonators that are connected in series with each other between an input terminal and an output terminal; and a parallel resonator that is connected between any of connection nodes between the input terminal, the output terminal and the four or more series resonators, and a reference terminal. Frequency differences that are differences between anti-resonant frequencies and resonant frequencies of all of the series resonators except for a first series resonator that is connected so as to be closest to the input terminal and a second series resonator that is connected so as to be closest to the output terminal among the four or more series resonators are smaller than frequency differences between the anti-resonant frequencies and the resonant frequencies of the first series resonator and the second series resonator, and the anti-resonant frequencies of all of the series resonators except for the first series resonator and the second series resonator are lower than the anti-resonant frequencies of the first series resonator and the second series resonator.

With this configuration, the frequency differences of all of the series resonators except for the first series resonator and the second series resonator are set to be smaller than the frequency differences of the first series resonator and the second series resonator while shifting the anti-resonant frequencies of all of the series resonators except for the first series resonator and the second series resonator that are connected so as to be closest to the input terminal and the output terminal to be lower than the anti-resonant frequencies of the first series resonator and the second series resonator. As a result, the resonant frequencies of all of the series resonators except for the first series resonator and the second series resonator are not shifted toward the low-frequency side, and therefore, the impedance characteristic inside the pass band is able to be maintained as a satisfactory characteristic. On the other hand, the anti-resonant frequencies of all of the series resonators except for the first series resonator and second series resonator are shifted toward the high-frequency end of the pass band, and consequently, steepness of insertion loss and isolation in an inter-band region at the high-frequency side of the pass band are improved. Therefore, high steepness of insertion loss is able to be achieved in an inter-band region at the high-frequency side of the pass band while maintaining desired impedance inside the pass band.

In addition, the four or more series resonators and the parallel resonator may each include an IDT electrode that is provided on a substrate including a piezoelectric layer, and repeating pitches of a plurality of electrode fingers that define the IDT electrodes of all of the series resonators except for the first series resonator and the second series resonator may be larger than repeating pitches of a plurality of electrode fingers that define the IDT electrodes of the first series resonator and the second series resonator.

Thus, the wavelengths of all of the series resonators except for the first series resonator and the second series resonator are able to be made larger, and the anti-resonant frequencies of these series resonators are able to be made relatively lower.

In addition, the substrate including the piezoelectric layer may include a piezoelectric layer with the IDT electrodes provided on one surface thereof, a high-acoustic-velocity support substrate in which an acoustic velocity of a bulk wave that propagates therethrough is higher than an acoustic velocity of an elastic wave that propagates along the piezoelectric layer, and a low-acoustic-velocity film that is arranged between the high-acoustic-velocity support substrate and the piezoelectric layer, and in which an acoustic velocity of a bulk wave that propagates therethrough is lower than an acoustic velocity of an elastic wave that propagates along the piezoelectric layer.

When the frequency differences $\Delta f$ of all of the series resonators except for the first series resonator and the second series resonator are adjusted so as to be smaller than the frequency differences $\Delta f$ of the first series resonator and the second series resonator, it is assumed that the Q values of all of the series resonators except for the first series resonator and the second series resonator will become smaller. However, even in this case, with the above-described multilayer structure of the piezoelectric substrate, the Q values of all of the series resonators except for the first series resonator and the second series resonator are able to be maintained at high values.

In addition, the four or more series resonators may include five series resonators, and frequency differences that are differences between the anti-resonant frequencies and the resonant frequencies of three series resonators other than the first series resonator and the second series resonator among the five series resonators may be smaller than the frequency differences between the anti-resonant frequencies and the resonant frequencies of the first series resonator and the second series resonator, and the anti-resonant frequencies of the three series resonators other than the first series resonator and the second series resonator may be lower than the anti-resonant frequencies of the first series resonator and the second series resonator.

Furthermore, a multiplexer according to a preferred embodiment of the present invention includes a plurality of band pass filters that selectively allow prescribed frequency bands to pass therethrough, and that, thus, splits input signals. The frequency bands that are allowed to pass through the plurality of band pass filters are different from one another, and first ends of the plurality of band pass filters are connected to a common terminal, and at least one band pass filter other than a band pass filter having a highest frequency band among the plurality of band pass filters is the elastic wave filter according to a preferred embodiment of the present invention.

Thus, a multiplexer is provided that has high steepness of insertion loss in an inter-band region at the high-frequency side of the pass band while maintaining desired impedance inside the pass band.

In addition, a duplexer according to a preferred embodiment of the present invention includes a transmission filter and a reception filter, in which one end of the transmission filter and one end of the reception filter are commonly connected to an antenna terminal. The filter through which the lower frequency band is allowed to pass out of the transmission filter and the reception filter is the elastic wave filter according to a preferred embodiment of the present invention.

Thus, a duplexer is provided that has high steepness of insertion loss in an inter-band region at the high-frequency side of the pass band while maintaining desired impedance inside the pass band.

Furthermore, a high-frequency front end circuit according to a preferred embodiment of the present invention includes an elastic wave filter described above, a multiplexer described above, or a duplexer described above; and an amplification circuit that is connected to the elastic wave filter, the multiplexer, or the duplexer.

Thus, a high-frequency front end circuit is provided that includes an elastic wave filter that has high steepness in the bandpass characteristic outside a pass band while maintaining a desired impedance inside the pass band even for a frequency standard that has wide pass bands and a narrow interval between adjacent bands.

In addition, a communication device according to a preferred embodiment of the present invention includes an RF signal processing circuit that processes a high-frequency signal transmitted or received by an antenna element; and the high-frequency front end circuit described above, which transmits the high-frequency signal between the antenna element and the RF signal processing circuit.

Thus, a communication device is provided that includes an elastic wave filter that has high steepness in the bandpass characteristic outside a pass band while maintaining a desired impedance inside the pass band even for a frequency standard that has wide pass bands and a narrow interval between adjacent bands.

With elastic wave filters according to various preferred embodiments of the present invention, elastic wave filters, multiplexers, and duplexers are provided that have high steepness in a bandpass characteristic outside a pass band while maintaining a desired impedance inside the pass band even for a frequency standard that has wide pass bands and a narrow interval between adjacent bands.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
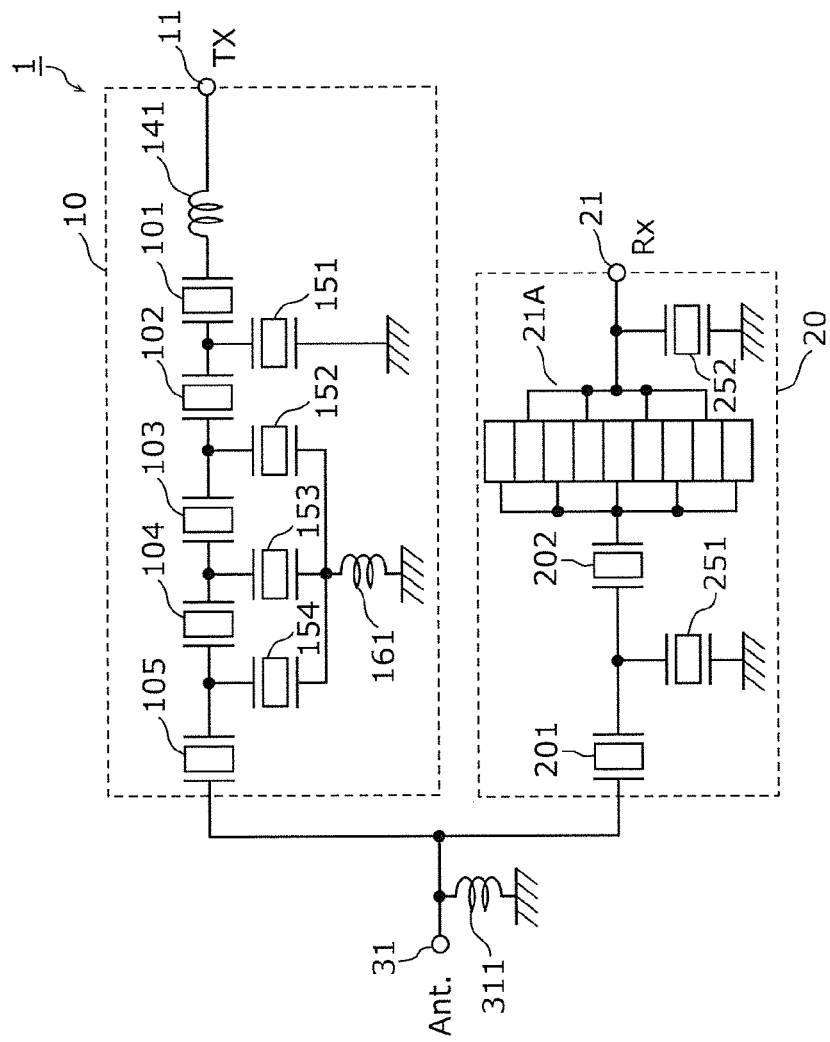
FIG. 1 is a circuit configuration diagram of a duplexer according to an example of a preferred embodiment of the present invention.

Hereafter, preferred embodiments of the present invention will be described in detail using examples and the drawings. Each example described hereafter illustrates a comprehensive or specific example. The numerical values, shapes, materials, elements, arrangements of the elements, the ways in which the elements are connected and so forth described in the following examples are merely examples and are not intended to limit the present invention. Elements that are not described in the independent claims among the elements in the following examples are described as arbitrary elements. In addition, the sizes or size ratios of the elements illustrated in the drawings are not necessarily strictly accurate.

In a preferred embodiment of the present invention, an antenna duplexer that is applied to Band 25 (transmission pass band: 1850-1915 MHz, reception pass band: 1930-1995 MHz) of the long term evolution (LTE) standard is illustrated as an example.

FIG. 1 is a circuit configuration diagram of a duplexer 1 according to the example. As illustrated in FIG. 1, the duplexer 1 includes a transmission filter 10, a reception filter 20, an antenna terminal 31, and an inductance element 311.

The transmission filter 10 is an unbalanced input-unbalanced output band pass filter that is input with a transmission wave generated by a transmission circuit (RFIC or the like) via a transmission input terminal 11, filters the transmission wave using a transmission pass band, and outputs the filtered transmission wave to the antenna terminal 31, which is a transmission output terminal. The transmission filter 10 is an elastic wave filter that is a preferable element of the present invention, and is preferably a ladder surface acoustic wave filter. The configuration of the transmission filter 10 is described in detail in the configuration of the transmission filter, which is described later.

The reception filter 20 is preferably an unbalanced input-unbalanced output band pass filter that is input with a reception wave input from the antenna terminal 31, which also defines and functions as a reception input terminal, filters the reception wave using a reception pass band, and outputs the filtered reception wave to a reception output terminal 21. The reception filter 20 includes a longitudinally-coupled surface acoustic wave filter section, for example. More specifically, the reception filter 20 preferably includes a longitudinally-coupled filter section 21A, series resonators 201 and 202, and parallel resonators 251 and 252.

The inductance element 311 is an impedance matching element that is provided between the antenna terminal 31 and a connection point between the transmission filter 10 and the reception filter 20. Thus, impedance matching is able to be provided between the antenna element, and the transmission filter 10 and the reception filter 20.

The structure of a resonator that is an element of the transmission filter 10 and the reception filter 20 will be described.

Figure 2:
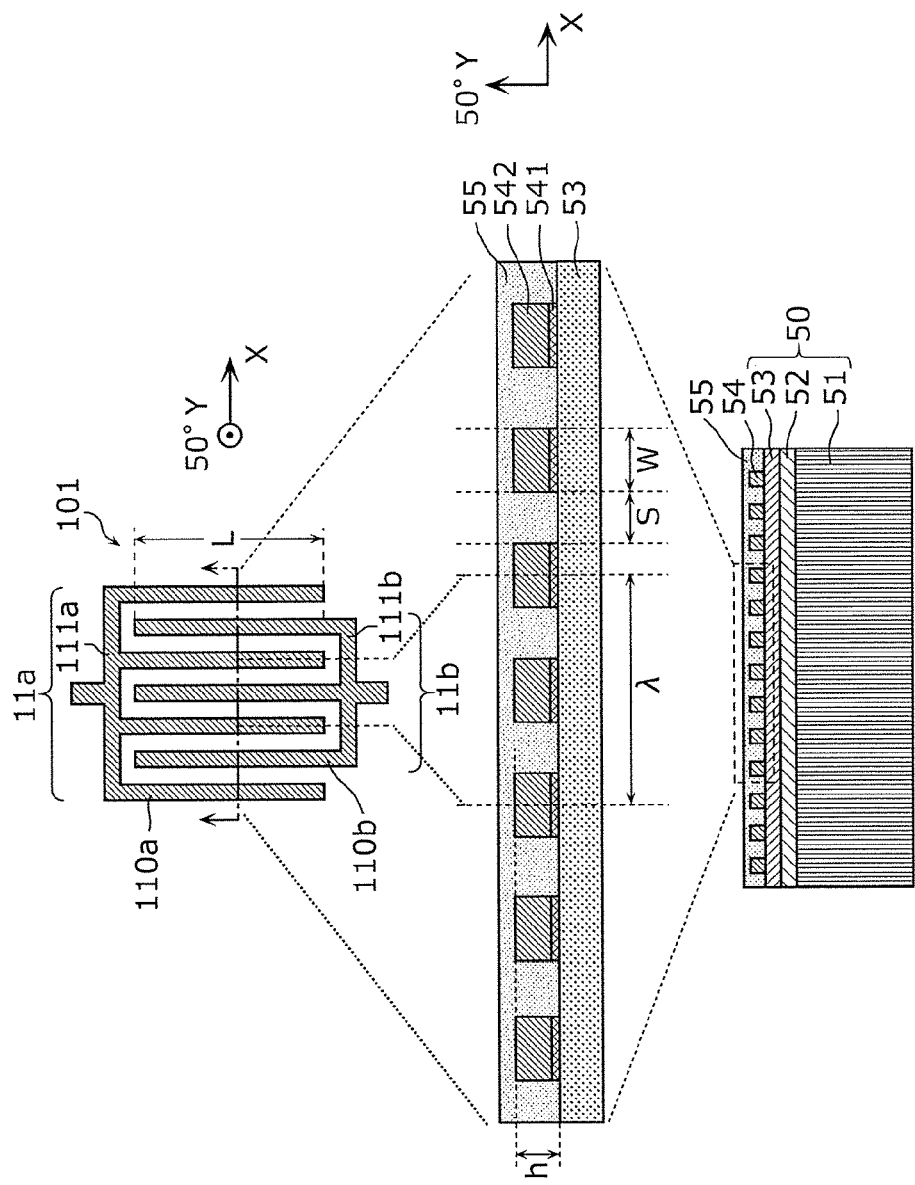
FIG. 2 includes a plan view and a sectional view that schematically illustrate a resonator of a surface acoustic wave filter according to an example of a preferred embodiment of the present invention.

FIG. 2 includes a plan view and a sectional view that schematically illustrate a resonator of a surface acoustic wave filter according to the example. FIG. 2 illustrates examples of a schematic plan view and a schematic sectional view that illustrate the structure of a series resonator 101 among a plurality of resonators that define the transmission filter 10 and the reception filter 20. The series resonator 101 illustrated in FIG. 2 is for explaining the structure of the plurality of resonators, and the numbers, lengths and other parameters of the electrode fingers defining the electrodes are not limited to those illustrated.

The resonators of the transmission filter 10 and the reception filter 20 are each provided of a substrate 50 including a piezoelectric layer 53, and interdigital transducer (IDT) electrodes 11a and 11b having comb shapes.

As illustrated in the plan view of FIG. 2, the pair of IDT electrodes 11a and 11b, which face each other, are provided on the substrate 50. The IDT electrode 11a includes a plurality of electrode fingers 110a, which are parallel or substantially parallel to each other, and a busbar electrode 111a, which connects the plurality of electrode fingers 110a to each other. In addition, the IDT electrode lib includes a plurality of electrode fingers 110b, which are parallel or substantially parallel to each other, and a busbar electrode 111b, which connects the plurality of electrode fingers 110b to each other. The plurality of electrode fingers 110a and 110b extend in a direction orthogonal or substantially orthogonal to an X axis direction.

In addition, an IDT electrode 54, which includes the plurality of electrode fingers 110a and 110b and the busbar electrodes 111a and 111b, preferably has a multilayer structure that includes an adhesive layer 541 and a main electrode layer 542, for example, as illustrated in the sectional view of FIG. 2.

The adhesive layer 541 is a layer that improves adhesion between the substrate 50 and the main electrode layer 542, and, for example, Ti may preferably be used as the material thereof. The film thickness of the adhesive layer 541 is preferably about 12 nm, for example.

For example, Al including about 1% Cu is preferably used as the material of the main electrode layer 542. The film thickness of the main electrode layer 542 is preferably about 162 nm, for example.

A protective layer 55 is provided so as to cover the IDT electrodes 11a and 11b. The purpose of the protective layer 55 is to protect the main electrode layer 542 from the external environment, to adjust the frequency-temperature characteristic, and to increase moisture resistance, and the protective layer 55 is preferably a film including silicon dioxide as a main component, for example.

The materials defining the adhesive layer 541, the main electrode layer 542, and the protective layer 55 are not limited to the above-described materials. In addition, the IDT electrode 54 does not need to have the above-described multilayer structure. The IDT electrode 54 may be made of a metal, such as Ti, Al, Cu, Pt, Au, Ag or Pd, or an alloy of such a metal, or may be made of a plurality of multilayer bodies made of such a metal or alloy, for example. In addition, the protective layer 55 does not always need to be provided.

The multilayer structure of the substrate 50 will be described next.

As illustrated in the lower portion of FIG. 2, preferably, the substrate 50 includes a high-acoustic-velocity support substrate 51, a low-acoustic-velocity film 52, and the piezoelectric layer 53, and has a structure in which the high-acoustic-velocity support substrate 51, the low-acoustic-velocity film 52, and the piezoelectric layer 53 are stacked on top of one another in this order.

The piezoelectric layer 53 is preferably made of, for example, a 50° Y-cut X-propagation $LiTaO_3$ piezoelectric single crystal or a piezoelectric ceramic (lithium tantalate single crystal cut along a plane having a normal rotated by 50° from a Y axis around an X axis or a ceramic, and is a single crystal or a ceramic in which surface acoustic waves propagate in the X axis direction). The thickness of the piezoelectric layer 53 is preferably about 600 nm, for example.

The high-acoustic-velocity support substrate 51 is a substrate that supports the low-acoustic-velocity film 52, the piezoelectric layer 53 and the IDT electrode 54. The high-acoustic-velocity support substrate 51 is a substrate in which the acoustic velocity of a bulk wave inside the high-acoustic-velocity support substrate 51 is higher than the acoustic velocity of an elastic wave such as a surface acoustic wave or boundary waves that propagates along the piezoelectric layer 53, and the high-acoustic-velocity support substrate 51 functions so as to confine surface acoustic waves to a portion of the substrate in which the piezoelectric layer 53 and the low-acoustic-velocity film 52 are stacked and prevent the surface acoustic waves from leaking into the region below the high-acoustic-velocity support substrate 51. The high-acoustic-velocity support substrate 51 is preferably, for example, a silicon substrate, and has a thickness of, for example, about 200 μm.

The low-acoustic-velocity film 52 is a film in which the acoustic velocity of a bulk wave inside the low-acoustic-velocity film 52 is lower than the acoustic velocity of an elastic wave that propagates along the piezoelectric layer 53, and the low-acoustic-velocity film 52 is arranged between the piezoelectric layer 53 and the high-acoustic-velocity support substrate 51. Leakage of the energy of surface acoustic waves to outside the IDT electrode is reduced or prevented with this structure and the property that the energy of elastic waves is concentrated in a medium in which the elastic waves fundamentally have a low acoustic velocity. The low-acoustic-velocity film 52 is a film preferably including a main component of silicon dioxide, for example, and the thickness thereof is about 670 nm, for example.

With the above-described multilayer structure of the substrate 50, the Q value at the resonant frequency and the anti-resonant frequency are able to be greatly increased compared with a structure of the related art in which a piezoelectric substrate is used as a single layer. In other words, a surface acoustic wave resonator having a high Q value is able to be provided, and therefore, a filter having small insertion loss is able to be produced using the surface acoustic wave resonator.

In addition, as described later, in the case in which frequency differences Δf between the resonant frequencies and the anti-resonant frequencies of the series resonators 102 to 104, other than the series resonators 101 and 105 connected to the two terminals, of the transmission filter 10 are adjusted so as to smaller than the frequency differences Δf of the series resonators connected to the two terminals, it would be assumed that the Q values of the series resonators 102 to 104 would be smaller than the Q values of the series resonators 101 and 105. However, even in such a case, with the above-described multilayer structure of the substrate 50, the Q values of the series resonators 102 to 104 is able to be maintained at high values. Therefore, a surface acoustic wave filter is provided that has low loss inside a pass band and high steepness outside the pass band even for a frequency standard that has wide pass bands and a narrow interval between adjacent bands.

The high-acoustic-velocity support substrate 51 may have a structure in which a support substrate and a high-acoustic-velocity film, in which the acoustic velocity of a propagating bulk wave is higher than that of an elastic wave such as a surface acoustic wave or a boundary wave that propagates along the piezoelectric layer 53, are stacked one on top of the other. In this case, for example, a piezoelectric material such as sapphire, lithium tantalate, lithium niobate or quartz, a dielectric material such as any of various ceramic materials such as alumina, magnesia, silicon nitride, aluminum nitride, silicon carbide, zirconia, cordierite, mullite, steatite and forsterite, and glass, a semiconductor material such as silicon and gallium nitride, and a resin substrate, for example, may preferably be used as the support substrate. In addition, any of various high-acoustic-velocity materials, such as aluminum nitride, aluminum oxide, silicon carbide, silicon nitride, silicon oxynitride, a DLC film, diamond, a material having any of these materials as a main component, or a material having a mixture of any of these materials as a main component, for example, may preferably be used as the high-acoustic-velocity film.

Next, the design parameters of the IDT electrodes are described. The wavelength of the surface acoustic wave resonator is defined by a repeating pitch λ of the plurality of electrode fingers 110a and 110b of the IDT electrodes 11a and 11b illustrated in the center portion of FIG. 2. Furthermore, as illustrated in the upper portion of FIG. 2, an intersecting width L of the IDT electrodes is an electrode finger length across which the electrode fingers 110a of the IDT electrode 11a and the electrode fingers 110b of the IDT electrode 11b overlap when viewed in the X axis direction. In addition, a duty ratio is a line width occupation ratio of the plurality of electrode fingers 110a and 110b, and is a ratio of the line width of the plurality of electrode fingers 110a and 110b to the sum of the line width and the spacing between the electrode fingers. More specifically, the duty ratio is defined by W/(W+S), where W is the line width of the electrode fingers 110a and 110b forming the IDT electrodes 11a and 11b and S is the spacing between adjacent electrode fingers 110a and 110b.

As illustrated in FIG. 1, the transmission filter 10 includes the series resonators 101 to 105, parallel resonators 151 to 154, matching-use inductance elements 141 and 161, and the transmission input terminal 11.

The series resonators 101 to 105 are connected in series with each other between the transmission input terminal 11 and the antenna terminal 31. In addition, the parallel resonators 151 to 154 are connected in parallel with each other between connection points between the transmission input terminal 11, the antenna terminal 31 and the series resonators 101 to 105, and reference terminals (ground). The transmission filter 10 defines a ladder band pass filter as a result of the series resonators 101 to 105 and the parallel resonators 151 to 154 being connected in the above-described manner. In addition, the inductance element 141 is connected between the transmission input terminal 11 and the series resonator 101, and the inductance element 161 is connected between a connection point between the parallel resonators 152, 153, and 154, and a reference terminal.

Table 1 illustrates in detail the design parameters of the series resonators 101 to 105 and the parallel resonators 151 to 154 of the transmission filter 10 according to this example (pitch λ, intersecting width L, number of IDT pairs N, duty ratio D).

TABLE 1

|  | SERIES RESONATOR 101 | SERIES RESONATOR 102 | SERIES RESONATOR 103 | SERIES RESONATOR 104 | SERIES RESONATOR 105 |
| --- | --- | --- | --- | --- | --- |
| PITCH λ (μm) | 1.9926 | 2.0163 | 2.0142 | 2.0167 | 2.0043 |
| INTERSECTING WIDTH L (μm) | 17.3 | 30.0 | 25.0 | 30.5 | 25.0 |
| NUMBER OF IDT PAIRS N | 140 | 147 | 94 | 107 | 98 |
| DUTY RATIO D | 0.5 | 0.5 | 0.5 | 0.5 | 0.5 |

|  | PARALLEL RESONATOR 151 | PARALLEL RESONATOR 152 | PARALLEL RESONATOR 153 | PARALLEL RESONATOR 154 |
| --- | --- | --- | --- | --- |
| PITCH λ (μm) | 2.0871 | 2.1042 | 2.0881 | 2.0875 |
| INTERSECTING WIDTH L (μm) | 60.2 | 75.7 | 30.6 | 49.2 |
| NUMBER OF IDT PAIRS N | 77 | 38 | 108 | 113 |
| DUTY RATIO D | 0.5 | 0.5 | 0.5 | 0.5 |

The pitch λ of each resonator illustrated in Table 1 is defined as the wavelength of the resonator. In addition, the capacitance of each resonator is determined by the design parameters illustrated in Table 1 and the dielectric constant and so forth of the piezoelectric substrate 50.

In this example, a T-type ladder filter is provided that includes nine resonators, but a π-type ladder filter may instead be provided. In addition, the number of resonators is not limited to nine, and it is sufficient that there be four or more series resonators.

Here, Δf1 is defined as the frequency difference (fas1−frs1) between an anti-resonant frequency fas1 and a resonant frequency frs1 of the series resonator 101 (first resonator) that is connected so as to be closest to the transmission input terminal 11. In addition, Δf5 is defined as the frequency difference (fas5−frs5) between an anti-resonant frequency fas5 and a resonant frequency frs5 of the series resonator 105 that is connected so as to be closest to the antenna terminal 31. Similarly, Δf2 (=fas2−frs2), Δf3 (=fas3−frs3), and Δf4 (=fas4−frs4) are respectively defined as the frequency differences between anti-resonant frequencies fas2, fas3, and fas4 and resonant frequencies frs2, frs3, and frs4 of the series resonators 102, 103 and 104 other than the series resonators 101 and 105.

In the transmission filter 10 according to this example, the following relational formulas (Formula 1) and (Formula 2) are satisfied.

$$fas1, fas5 > fas2, fas3, fas4 \quad \text{(Formula 1)}$$

$$\Delta f1, \Delta f5 > \Delta f2, \Delta f3, \Delta f4 \quad \text{(Formula 2)}$$

In other words, the frequency differences Δf2, Δf3, and Δf4 between the anti-resonant frequencies and the resonant frequencies of all of the series resonators 102, 103, and 104 other than the series resonator 101 connected so as to be closest to the transmission input terminal 11 and the series resonator 105 connected so as to be closest to the antenna terminal 31 are preferably smaller than the frequency differences Δf1 and Δf5 between the anti-resonant frequencies and the resonant frequencies of the series resonators 101 and 105, and the anti-resonant frequencies fas2, fas3, and fas4 of the series resonators 102, 103 and 104 are preferably lower than the anti-resonant frequencies fas1 and fas5 of the series resonators 101 and 105.

As a configuration for achieving Formula 1, the wavelengths of the series resonators 102, 103, and 104 may be made larger than the wavelengths of the series resonators 101 and 105. In other words, the relationship represented by Formula 1 may be achieved using the configuration represented by below Formula 3, where λ1 to λ5 respectively represent the repeating pitches of the plurality of electrode fingers that form the IDT electrodes of the series resonators 101 to 105.

$$\lambda 1, \lambda 5 < \lambda 2, \lambda 3, \lambda 4 \quad \text{(Formula 3)}$$

Thus, the transmission filter 10 is able to be provided that has high steepness in the bandpass characteristic outside the pass band while maintaining desired impedance inside the pass band even for a frequency standard that has wide pass bands and a narrow interval between adjacent bands such as Band 25, and the duplexer 1 that includes the transmission filter 10 can be provided.

In the present preferred embodiment, IDT electrode withdrawal weighting, for example, is preferably used as a design technique to make the frequency differences Δf2, Δf3, and Δf3 of the series resonators 102 to 104 smaller than those of the series resonators 101 and 105. Techniques other than IDT electrode withdrawal weighting, such as connecting capacitors in parallel with resonators or changing the electrode film thickness or duty ratio of the resonators, may be used as a technique to make frequency differences Δf smaller. The same effect is obtained when any of these techniques is used as a way of adjusting Δf in preferred embodiments of the present invention.

Description will be provided later regarding the fact that the transmission filter 10 and the duplexer 1 having the characteristics realized by Formulas 1 to 3 have high steepness in the bandpass characteristic outside the pass band while maintaining desired impedance inside the pass band.

As illustrated in FIG. 1, the reception filter 20 includes the longitudinally-coupled filter section 21A, a ladder filter section including the series resonators 201 and 202 and the parallel resonator 251, and a trap section including the parallel resonator 252.

Figure 3:
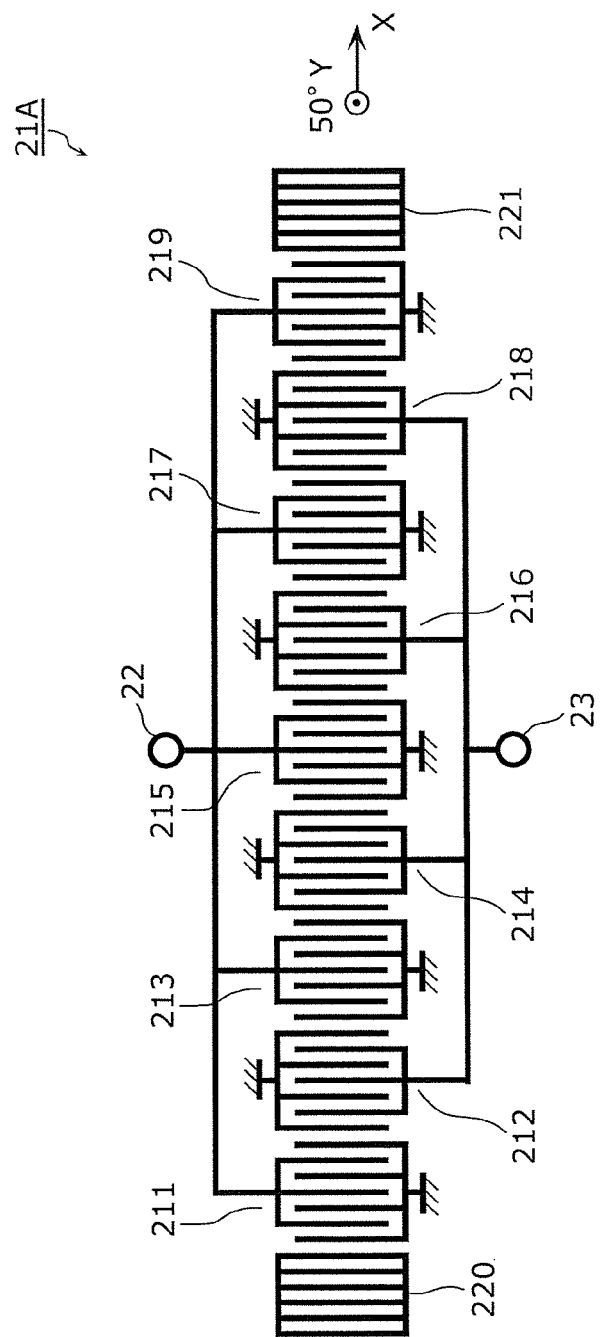
FIG. 3 is a schematic plan view illustrating an electrode configuration of a longitudinally-coupled surface acoustic wave filter according to an example of a preferred embodiment of the present invention.

FIG. 3 is a schematic plan view illustrating the electrode configuration of the longitudinally-coupled filter section 21A according to the example. As illustrated in FIG. 3, the longitudinally-coupled filter section 21A includes IDTs 211 to 219, reflectors 220 and 221, an input terminal 22, and an output terminal 23.

The IDTs 211 to 219 each preferably include a pair of IDT electrodes that face each other. The IDTs 214 and 216 sandwich the IDT 215 therebetween in the X axis direction, and the IDTs 213 and 217 sandwich the IDTs 214 to 216 therebetween in the X axis direction. In addition, the IDTs 212 and 218 sandwich the IDTs 213 to 217 therebetween in the X axis direction, and the IDTs 211 and 219 sandwich the IDTs 212 to 218 therebetween in the X axis direction. The reflectors 220 and 221 sandwich the IDTs 211 to 219 therebetween in the X axis direction. In addition, the IDTs 211, 213, 215, 217, and 219 are connected in parallel between the input terminal 22 and reference terminals (ground), and the IDTs 212, 214, 216, and 218 are connected in parallel between the output terminal 23 and reference terminals.

The basic structures of the IDTs 211 to 219, the series resonators 201 and 202, and the parallel resonators 251 and 252 are similar to those illustrated in FIG. 2.

Next, the preferred operational principles of a ladder surface acoustic wave filter according to the present preferred embodiment are described.

The parallel resonators 151 to 154 illustrated in FIG. 1 each have a resonant frequency frp and an anti-resonant frequency fap (>frp) in the resonance characteristic thereof. In addition, the series resonators 101 to 105 each have a resonant frequency frs and an anti-resonant frequency fas (>frs>frp) in the resonance characteristic thereof. Although the resonant frequencies frs of the series resonators 101 to 105 are designed so as to match or substantially match each other, the resonant frequencies frs do not always perfectly match each other due to the fact that the design parameters of the resonators differ from each other as illustrated in Table 1. In addition, the anti-resonant frequencies fas of the series resonators 101 to 105, the resonant frequencies frp of the parallel resonators 151 to 154, and the anti-resonant frequencies fap of the parallel resonators 151 to 154 are similarly designed to respectively match one another, but the frequencies do not always perfectly match one another.

When structuring a ladder band pass filter using resonators, the anti-resonant frequencies fap of the parallel resonators 151 to 154 and the resonant frequencies frs of the series resonators 101 to 105 are set to be close to each other. Thus, a low-frequency-side stop band is provided in the vicinity of the resonant frequencies frp of the parallel resonators 151 to 154 where the impedances of the parallel resonators 151 to 154 are close to zero. In addition, as the frequency increases from this point, the impedances of the parallel resonators 151 to 154 become higher in the vicinity of the anti-resonant frequencies fap of the parallel resonators

151 to 154 and the impedances of the series resonators 101 to 105 approach zero in the vicinity of the resonant frequencies frs. Thus, a signal pass band is provided in the vicinity of frequencies ranging from the anti-resonant frequencies fap to the resonant frequencies frs in a signal path from the transmission input terminal 11 to the antenna terminal 31. As the frequency increases still further and approaches the anti-resonant frequencies fas, the impedances of the series resonators 101 to 105 become higher, and a high-frequency-side stop band is provided. In other words, the steepness of the attenuation characteristic in the high-frequency-side stop band is greatly affected by where the anti-resonant frequencies fas of the series resonators 101 to 105 are set outside the signal pass band.

In the transmission filter 10 having the structure illustrated in FIGS. 1 and 2 and the preferred operational principles described above, when a high-frequency signal is input thereto from the transmission input terminal 11, a potential difference is generated between the transmission input terminal 11 and the reference terminals, and as a result, a surface acoustic wave that propagates in the X direction is generated through deformation of the piezoelectric substrate 50. In this case, the pitch $\lambda$ of the IDT electrodes 11*a* and 11*b* and the wavelength of the pass band are set to match or substantially match each other, and consequently, only a high-frequency signal having a signal component that is desired is allow to pass passes through the transmission filter 10.

Hereafter, the frequency characteristics of the transmission filter 10 according to this example are described while comparing the frequency characteristics of the transmission filter 10 with those of transmission filters according to comparative examples.

Figure 4A:
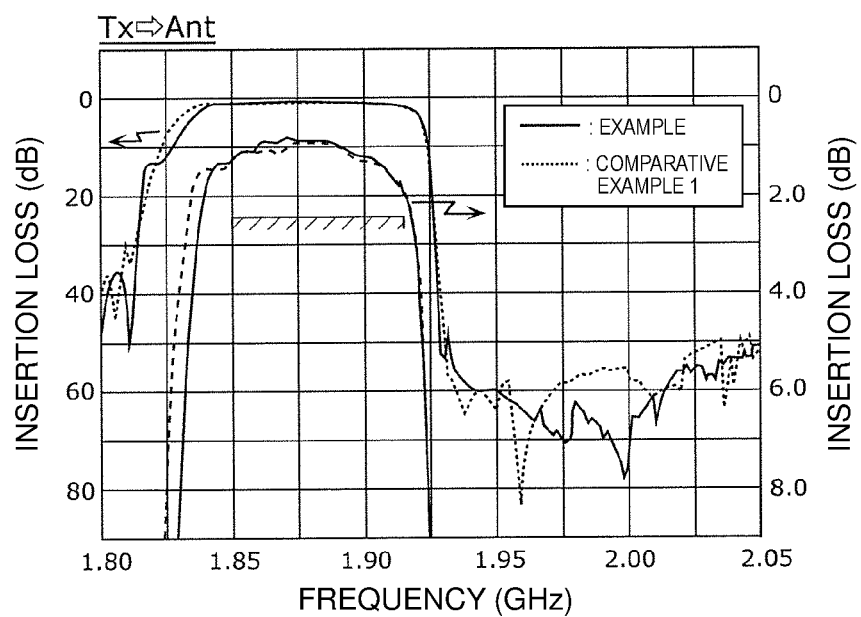
FIG. 4A is a graph that compares the bandpass characteristics of transmission filters according to an example of a preferred embodiment of the present invention and a comparative example 1.
Figure 4B:
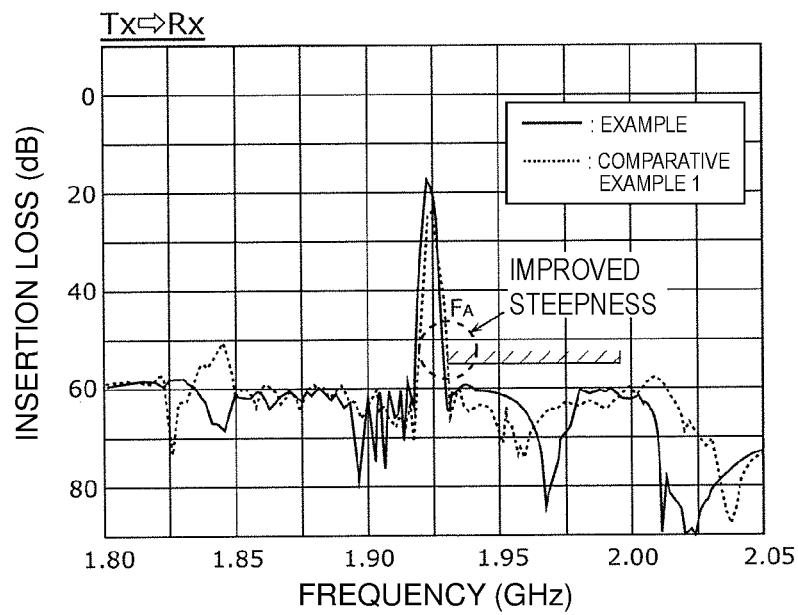
FIG. 4B is a graph that compares the isolation characteristics between a transmission input terminal and a reception output terminal according to an example of a preferred embodiment of the present invention and the comparative example 1.
Figure 4C:
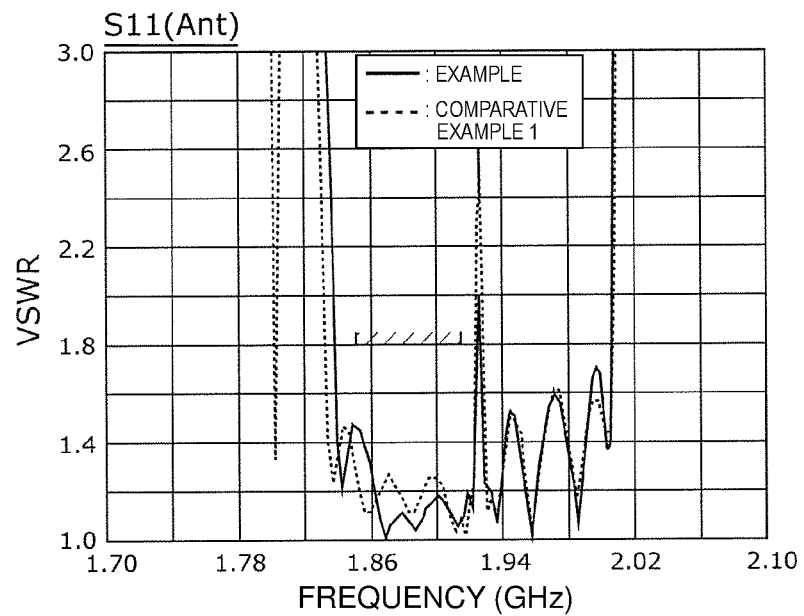
FIG. 4C is a graph that compares the values of VSWR at the antenna terminal sides of the transmission filters according to an example of a preferred embodiment of the present invention and the comparative example 1.
Figure 4D:
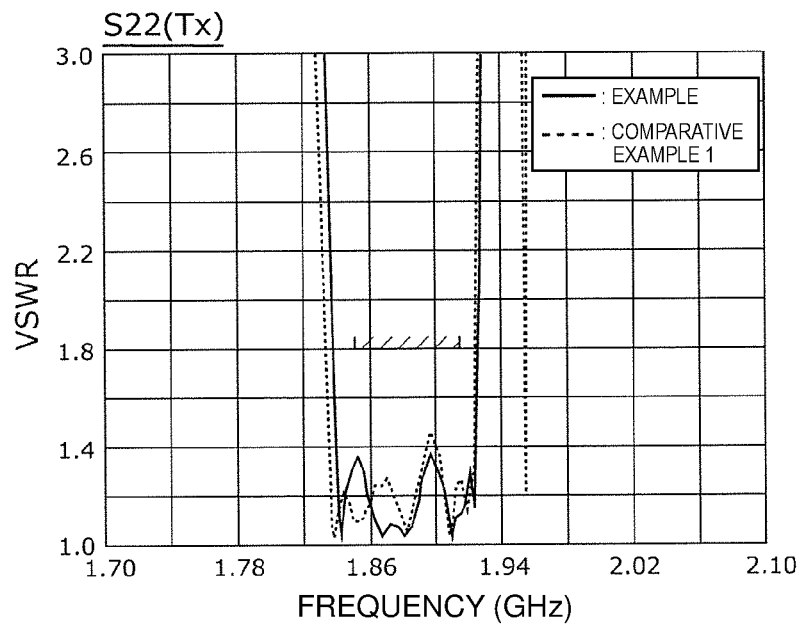
FIG. 4D is a graph that compares the values of VSWR on the transmission input terminal sides of the transmission filters according to an example of a preferred embodiment of the present invention and the comparative example 1.

FIG. 4A is a graph that illustrates the bandpass characteristics of transmission filters according to the example and a comparative example 1. In addition, FIG. 4B is a graph that illustrates the isolation characteristics between the transmission input terminal 11 and the reception output terminal 21 according to the example and the comparative example 1. Furthermore, FIG. 4C is a graph that illustrates the values of VSWR at the antenna terminal sides of the transmission filters according to the example and the comparative example 1. In addition, FIG. 4D is a graph that illustrates the values of VSWR at the transmission terminal sides of the transmission filters according to the example and the comparative example 1.

The transmission filter according to the comparative example 1 illustrated in FIGS. 4A to 4D is identical or substantially identical to the transmission filter 10 according to the example in that the transmission filter has the ladder configuration illustrated in FIG. 1, i.e., five series resonators and four parallel resonators, but differs in terms of the design parameters of the resonators. Specifically, the design parameters of the resonators of the transmission filter according to the comparative example 1 are set so as to satisfy the following relational formulas.

$$\text{fas71, fas72, fas73, fas75} > \text{fas74} \quad \text{(Formula 4)}$$

$$\Delta \text{f71} \approx \Delta \text{f72} \approx \Delta \text{f73} \approx \Delta \text{f74} \approx \Delta \text{f75} \quad \text{(Formula 5)}$$

The series resonators of the transmission filter according to the comparative example 1 are referred to as series resonators 701, 702, 703, 704, and 705 in order from the transmission input terminal. In addition, the resonant frequencies of the series resonators 701 to 705 are respectively referred to as frs71 to frs75, and the anti-resonant frequencies of the series resonators 701 to 705 are respectively referred to as fas71 to fas75. Furthermore, frequency differences between the resonant frequencies and the anti-resonant frequencies of the series resonators 701 to 705 are respectively referred to as $\Delta$f71 to $\Delta$f75.

That is, in the transmission filter according to the comparative example 1, the anti-resonant frequency fas74 of the series resonator 704 that is not closest to either the transmission input terminal or the antenna terminal is lower than the anti-resonant frequency fas71, fas72, fas73, and fas75 of the other four series resonators. On the other hand, the anti-resonant frequencies fas72 and fas73 of the series resonators 702 and 703 are the same as or higher than the anti-resonant frequencies fas71 and fas75 of the series resonators 701 and 705. In addition, the frequency differences $\Delta$f71 to $\Delta$f75 of the five series resonators are identical or substantially identical.

FIGS. 5A to 5E are graphs that respectively illustrate the impedance characteristics of the series resonators 101 to 105 of the transmission filter according to the example. In addition, FIGS. 6A to 6E are graphs that respectively illustrate the impedance characteristics of the series resonators 701 to 705 of the transmission filter according to the comparative example 1. The graphs of frequency characteristics illustrated in FIGS. 5A to 5E and FIGS. 6A to 6E illustrate the bandpass characteristics of the transmission filters (left-side vertical axis: S21), and illustrate the impedance characteristics of the series resonators of the transmission filters (right-side vertical axis: 20 log|Z|).

Figure 6A:
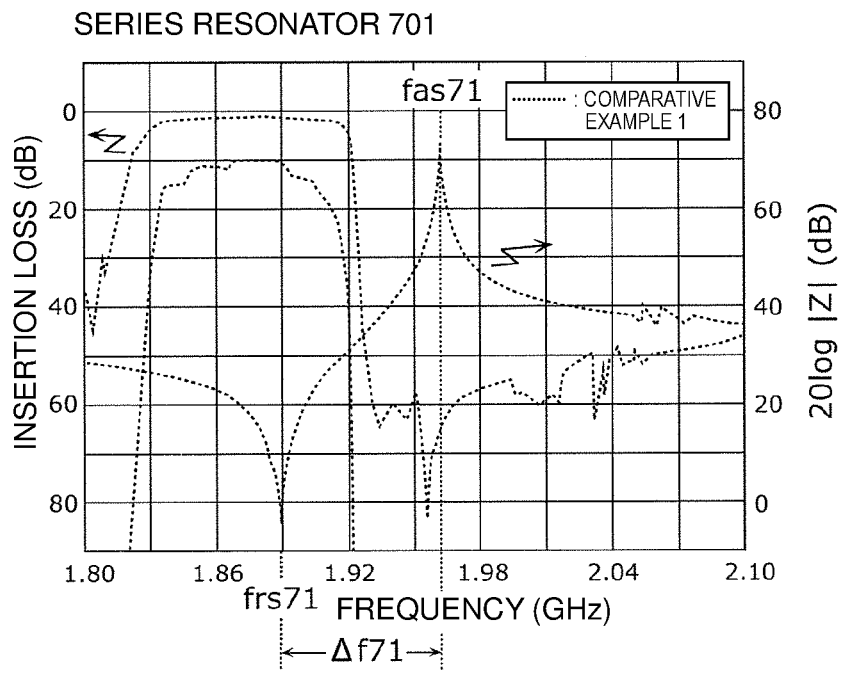
FIG. 6A is a graph depicting the impedance characteristic of a first series resonator of a transmission filter according to the comparative example 1.
Figure 6B:
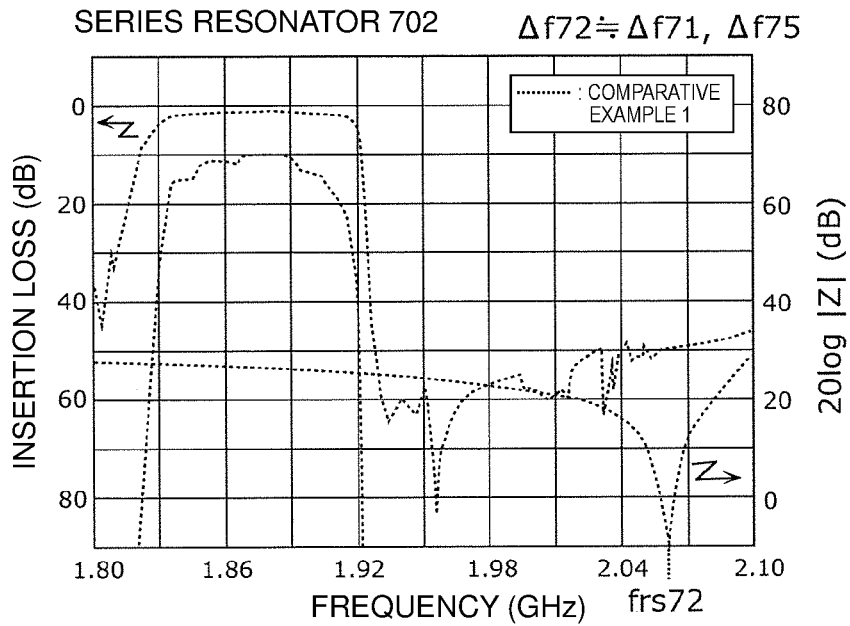
FIG. 6B is a graph depicting the impedance characteristic of a second series resonator of the transmission filter according to the comparative example 1.
Figure 6C:
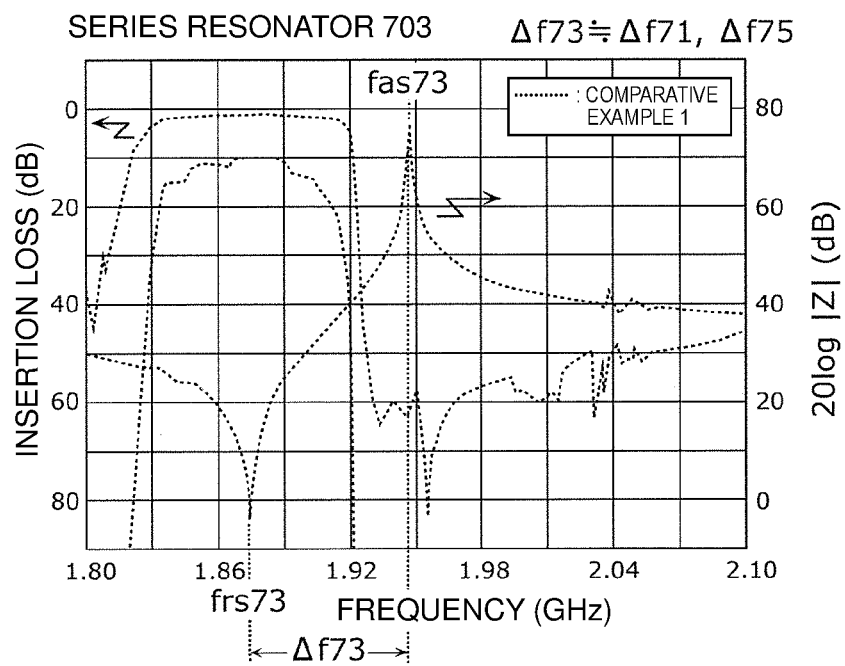
FIG. 6C is a graph depicting the impedance characteristic of a third series resonator of the transmission filter according to the comparative example 1.
Figure 6D:
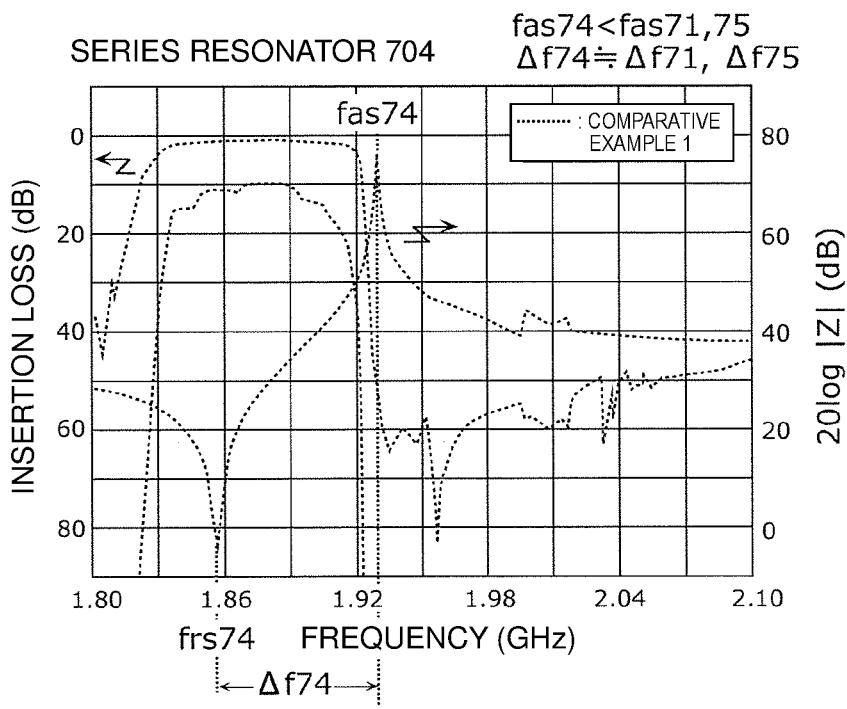
FIG. 6D is a graph depicting the impedance characteristic of a fourth series resonator of the transmission filter according to the comparative example 1.
Figure 6E:
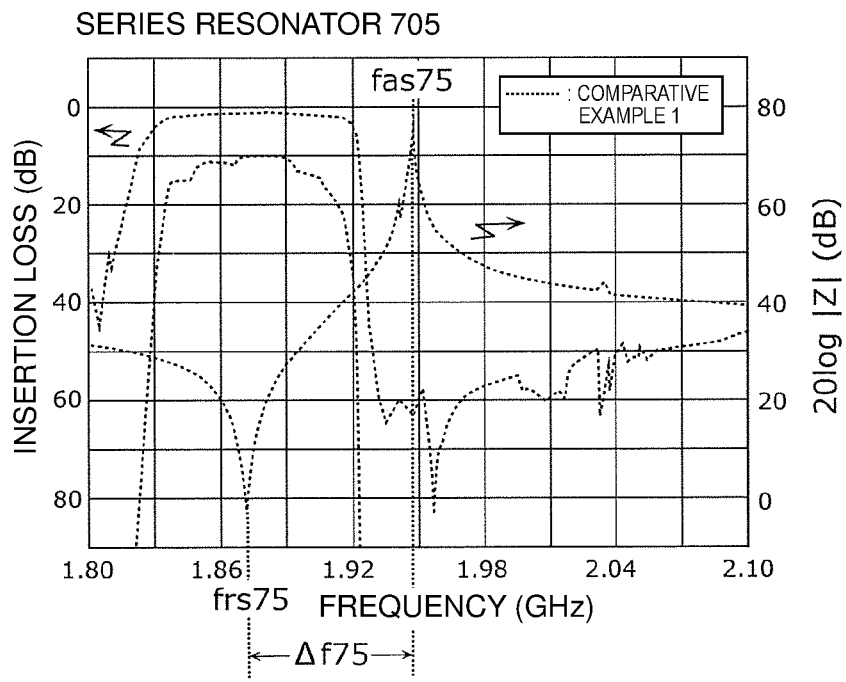
FIG. 6E is a graph depicting the impedance characteristic of a fifth series resonator of the transmission filter according to the comparative example 1.

Only the anti-resonant frequency fas4 of the series resonator 704 illustrated in FIG. 6D is closer to the high-frequency end of the transmission band than the anti-resonant frequencies fas71 and fas75 of the series resonators 701 and 705 illustrated in FIGS. 6A and 6E. In addition, the frequency differences $\Delta$f71 to $\Delta$f75 of the series resonators 701 to 705 illustrated in FIGS. 6A to 6E are identical or substantially identical. That is, in the transmission filter according to the comparative example 1, Formula 4 and Formula 5 hold true.

With the configuration of the comparative example 1, as illustrated in FIGS. 4A and 4B, isolation (insertion loss) between the transmission input terminal and the reception output terminal cannot achieve 55 dB in a transmission/reception inter-band region $F_A$ that is between the transmission band and the reception band, which is on the high-frequency side of the transmission band.

Figure 5A:
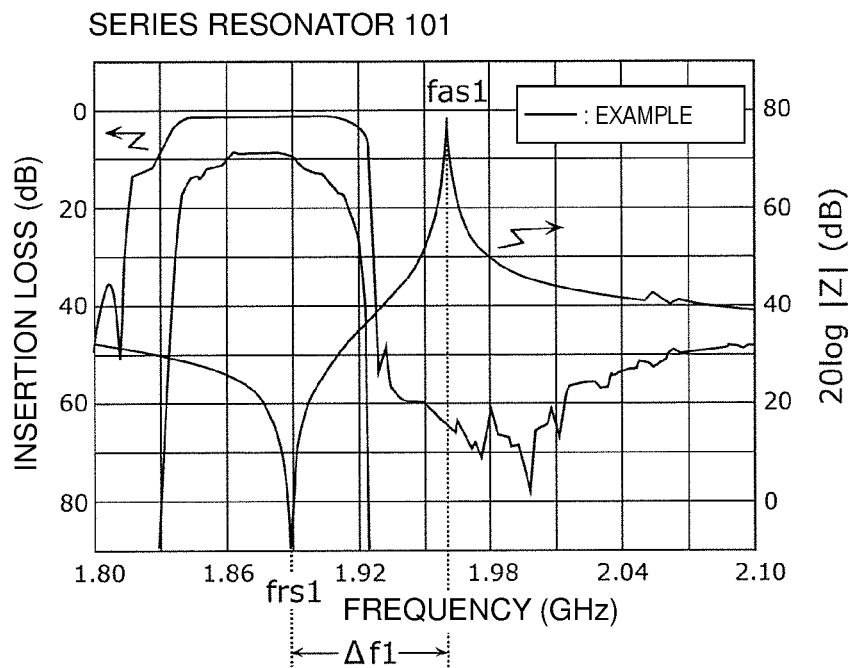
FIG. 5A is a graph depicting the impedance characteristic of a first series resonator of the transmission filter according to an example of a preferred embodiment of the present invention.
Figure 5B:
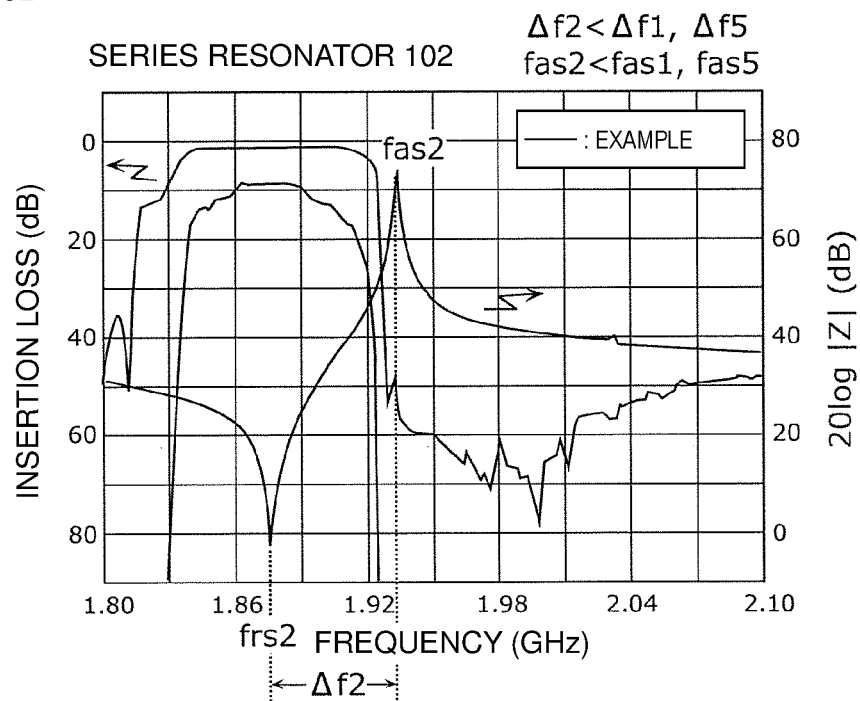
FIG. 5B is a graph depicting the impedance characteristic of a second series resonator of the transmission filter according to an example of a preferred embodiment of the present invention.
Figure 5C:
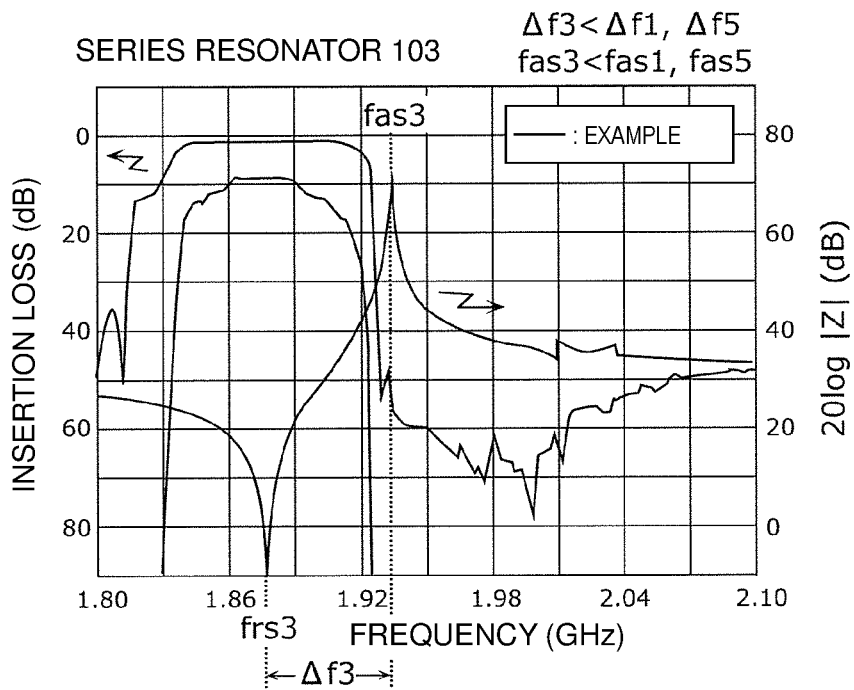
FIG. 5C is a graph depicting the impedance characteristic of a third series resonator of the transmission filter according to an example of a preferred embodiment of the present invention.
Figure 5D:
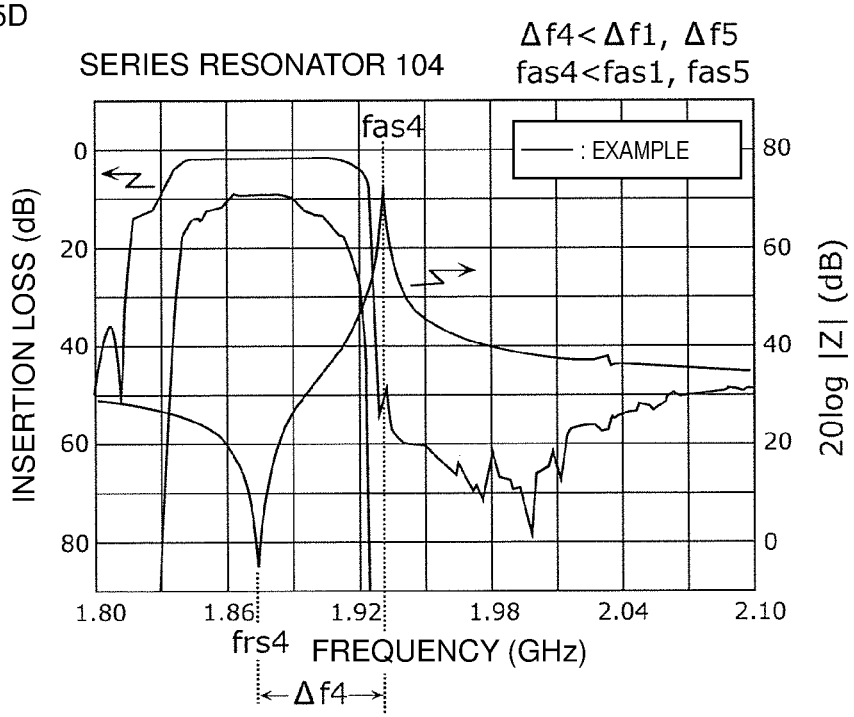
FIG. 5D is a graph depicting the impedance characteristic of a fourth series resonator of the transmission filter according to an example of a preferred embodiment of the present invention.
Figure 5E:
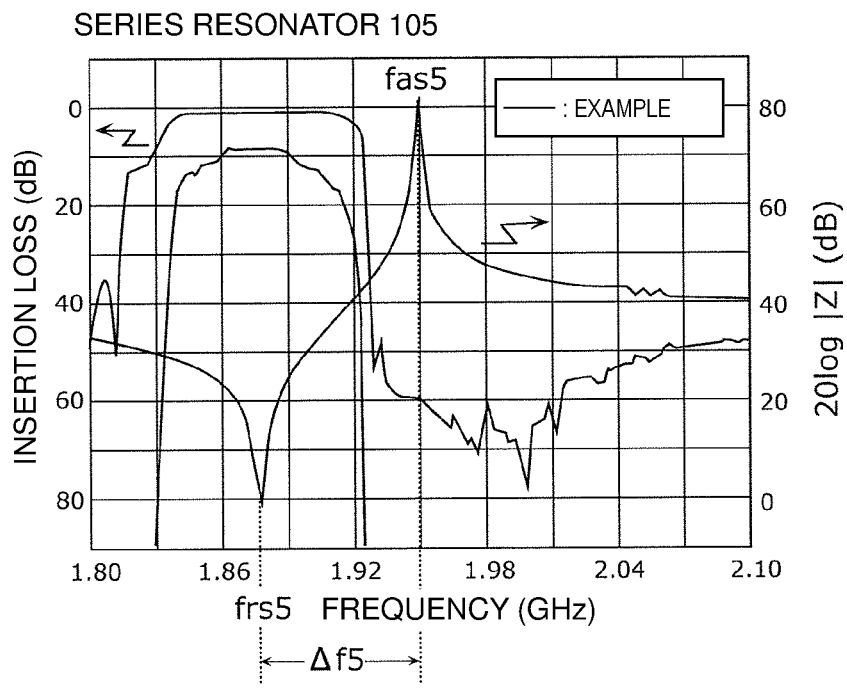
FIG. 5E is a graph depicting the impedance characteristic of a fifth series resonator of the transmission filter according to an example of a preferred embodiment of the present invention.

In contrast, in the transmission filter 10 according to the example, the anti-resonant frequencies fas2 to fas4 of the series resonators 102 to 104 illustrated in FIGS. 5B to 5D are closer to the high-frequency end of the transmission band than the anti-resonant frequencies fas1 and fas5 of the series resonators 101 and 105 illustrated in FIGS. 5A and 5E. In addition, the frequency differences $\Delta$f2 to $\Delta$f4 of the series resonators 102 to 104 illustrated in FIGS. 5B to 5D are smaller than the frequency differences $\Delta$f1 and $\Delta$f5 of the series resonators 101 and 105 illustrated in FIGS. 5A and 5E. That is, in the transmission filter according to the example, Formula 1 and Formula 2 hold true.

As illustrated in FIGS. 4A and 4B, the steepness of the attenuation characteristic in the transmission/reception inter-band region $F_A$ is improved by setting the anti-resonant frequencies fas2 to fas4 of the series resonators 102 to 104 to be closer to the high-frequency end of the transmission band. Specifically, the frequency interval from the high-frequency side of the transmission band (frequency at which insertion loss is less than or equal to about 2.5 dB) to the transmission/reception inter-band region (frequency at which isolation is about 55 dB) is about 1.6 MHz smaller in the example than in the comparative example 1.

The steepness of the insertion loss is improved in the high-frequency region of the transmission band, but as illustrated in FIGS. 4C and 4D, the voltage standing wave ratios (VSWR) seen from the antenna terminal 31 (FIG. 4C) and the transmission input terminal 11 (FIG. 4D) are maintained at satisfactory values inside the transmission band.

The capacitances of the series resonator 101 connected to the transmission input terminal 11 and the series resonator 105 connected to the antenna terminal are decided upon from the viewpoint of securing the desired insertion loss and the desired impedance in the pass band. In this case, the resonant frequencies frs1 and frs5 of the series resonators 101 and 105 are set so as to be close to the center frequency of the transmission band. When the anti-resonant frequencies fas2 to fas4 of the series resonators 102 to 104 are set to be closer to the high-frequency end of the transmission band than fas1 and fas5, and $\Delta$f2 to $\Delta$f4 are maintained as being identical or substantially identical to $\Delta$f1 and $\Delta$f5, the resonant frequencies frs2 to frs4 are shifted towards the low-frequency side from the center frequency of the transmission band. In this case, the impedance characteristic inside the transmission band is degraded due to the resonant frequencies being shifted toward the low-frequency side. In contrast, in the transmission filter 10 according to this example, $\Delta$f2 to $\Delta$f4 are made smaller while the anti-resonant frequencies fas2 to fas4 are shifted toward the low-frequency side. As a result, even though the anti-resonant frequencies fas2 to fas4 are shifted so as to be lower than fas1 and fas5, the resonant frequency frs2 to frs4 are not shifted toward the low-frequency side, and therefore, the impedance characteristic inside the transmission band is able to be maintained. In other words, the transmission filter 10 according to this example achieves high steepness of insertion loss in the frequency region between the transmission band and the adjacent reception band while maintaining the desired impedance inside the transmission band.

Figure 7A:
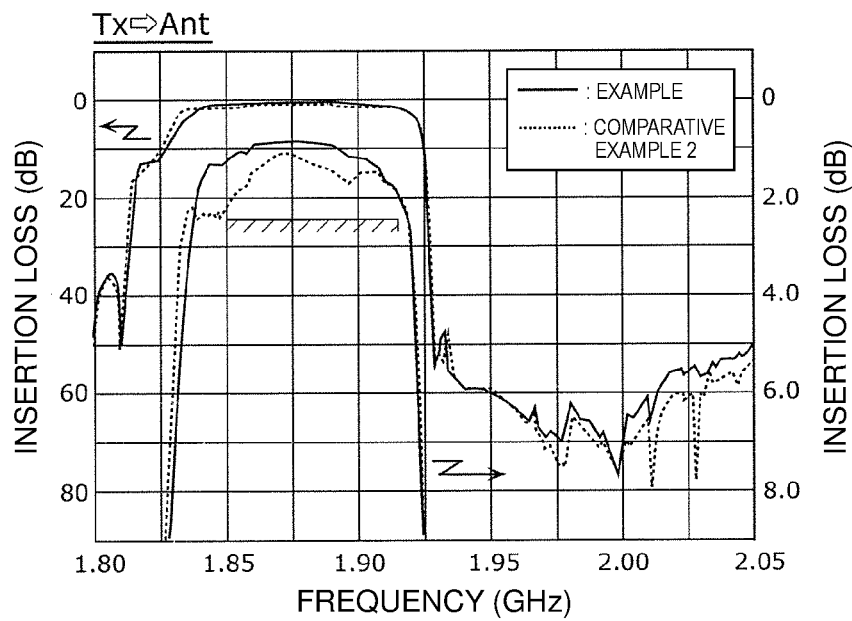
FIG. 7A is a graph that compares the bandpass characteristics of transmission filters according to an example of a preferred embodiment of the present invention and a comparative example 2.
Figure 7B:
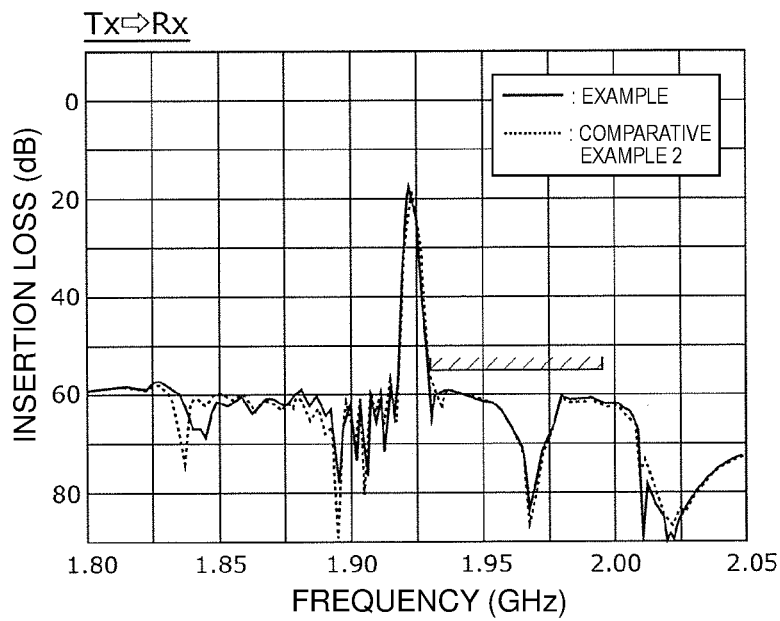
FIG. 7B is a graph that compares the isolation characteristics between a transmission input terminal and a reception output terminal according to an example of a preferred embodiment of the present invention and the comparative example 2.
Figure 7C:
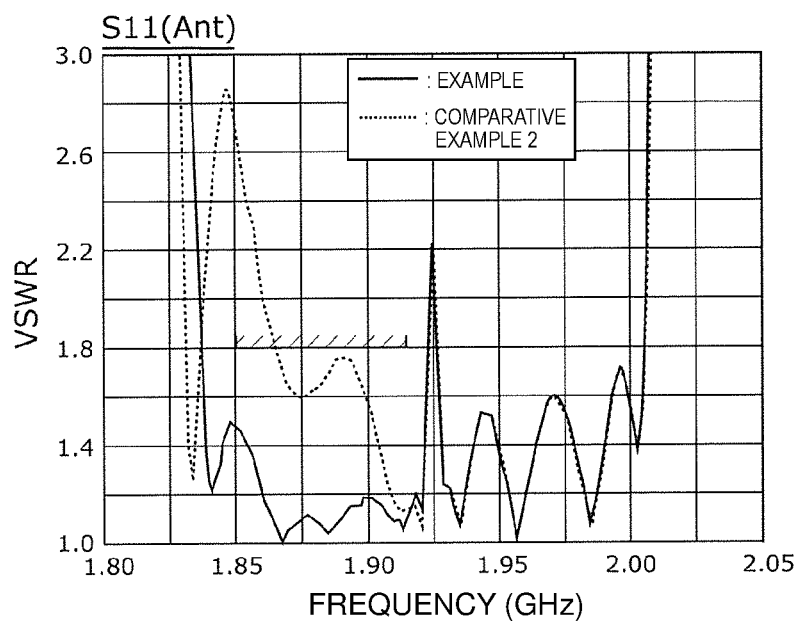
FIG. 7C is a graph that compares the values of VSWR on the antenna terminal sides of transmission filters according to an example of a preferred embodiment of the present invention and the comparative example 2.
Figure 7D:
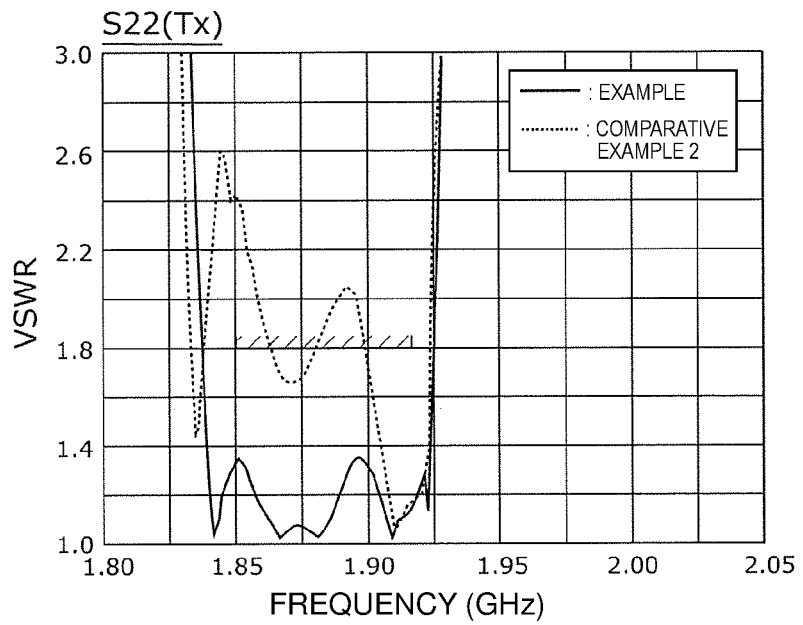
FIG. 7D is a graph that compares the values of VSWR on the transmission input terminal sides of the transmission filters according to an example of a preferred embodiment of the present invention and the comparative example 2.

FIG. 7A is a graph that illustrates the bandpass characteristics of transmission filters according to the example and a comparative example 2. In addition, FIG. 7B is a graph that illustrates the isolation characteristics between the transmission input terminal 11 and the reception output terminal 21 according to the example and the comparative example 2. Furthermore, FIG. 7C is a graph that illustrates the values of VSWR at the antenna terminal sides of the transmission filters according to the example and the comparative example 2. In addition, FIG. 7D is a graph that illustrates the values of VSWR at the transmission terminal sides of the transmission filters according to the example and the comparative example 2.

The transmission filter according to the comparative example 2 illustrated in FIGS. 7A to 7D is identical or substantially identical to the transmission filter 10 according to the example in that the transmission filter has the ladder configuration illustrated in FIG. 1, i.e., five series resonators and four parallel resonators, but differs in terms of the design parameters of the resonators. Specifically, the design parameters of the resonators of the transmission filter according to the comparative example 2 are set so as to satisfy the following relational formulas.

$$\text{fas81,fas85} > \text{fas82,fas83,fas84} \quad \text{(Formula 6)}$$

$$\Delta\text{f81} \approx \Delta\text{f82} \approx \Delta\text{f83} \approx \Delta\text{f84} \approx \Delta\text{f85} \quad \text{(Formula 7)}$$

The series resonators of the transmission filter according to the comparative example 2 are referred to as series resonators 801, 802, 803, 804, and 805 in order from the transmission input terminal. In addition, the resonant frequencies of the series resonators 801 to 805 are respectively referred to as frs81 to frs85, and the anti-resonant frequencies of the series resonators 801 to 805 are respectively referred to as fas81 to fas85. Furthermore, frequency differences between the resonant frequencies and the anti-resonant frequencies of the series resonators 801 to 805 are respectively referred to as $\Delta$f81 to $\Delta$f85.

That is, in the transmission filter according to the comparative example 2, the anti-resonant frequencies fas82 to fas84 of the series resonators 802 to 804 that are not closest to either the transmission input terminal or the antenna terminal are lower than the anti-resonant frequencies fas81 and fas85 of the series resonators 801 and 805. In addition, the frequency differences $\Delta$f81 to $\Delta$f85 of the five series resonators are identical or substantially identical.

The series resonators of the transmission filter according to the comparative example 2 satisfy the relationship of Formula 6, and consequently the anti-resonant frequencies fas82 to fas84 of the series resonators 802 to 804 are closer to the high-frequency end of the transmission band than the anti-resonant frequencies fas81 and fas85 of the series resonators 801 and 805. However, as illustrated in FIG. 7B, isolation around the low-frequency end (1930 MHz) of the reception band is not improved.

On the other hand, the series resonators of the transmission filter according to comparative example 2 satisfy the relations of Formula 6 and Formula 7, and consequently, the resonant frequencies frs82 to frs84 of the series resonators 802 to 804 are shifted toward the low-frequency side from the center frequency of the transmission band. Therefore, as illustrated in FIGS. 7C and 7D, the voltage standing wave ratios (VSWR) seen from the antenna terminal 31 (FIG. 7C) and the transmission input terminal 11 (FIG. 7D) are degraded inside the transmission band. In other words, the impedance characteristic inside the transmission band is degraded due to the resonant frequencies being shifted toward the low-frequency side.

Figure 8A:
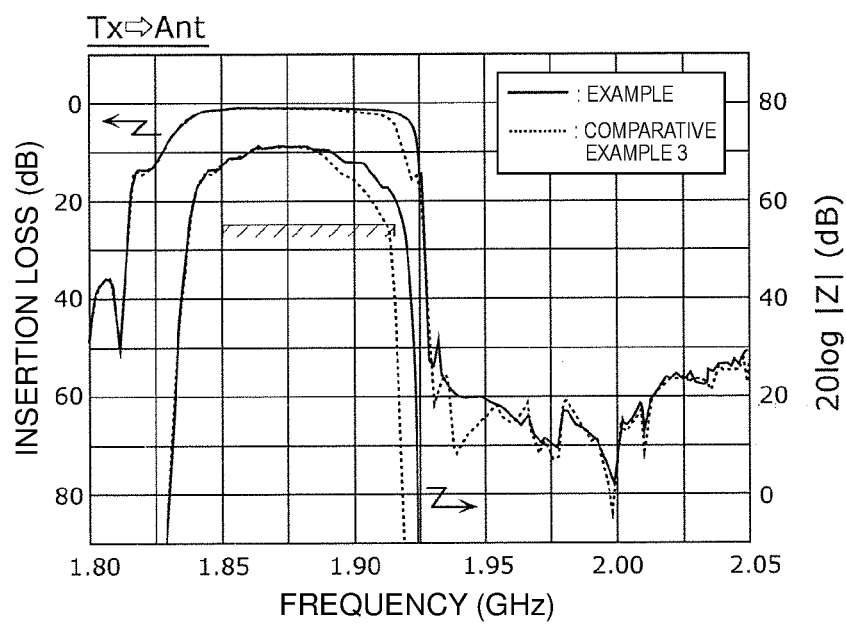
FIG. 8A is a graph that compares the bandpass characteristics of transmission filters according to an example of a preferred embodiment of the present invention and a comparative example 3.
Figure 8B:
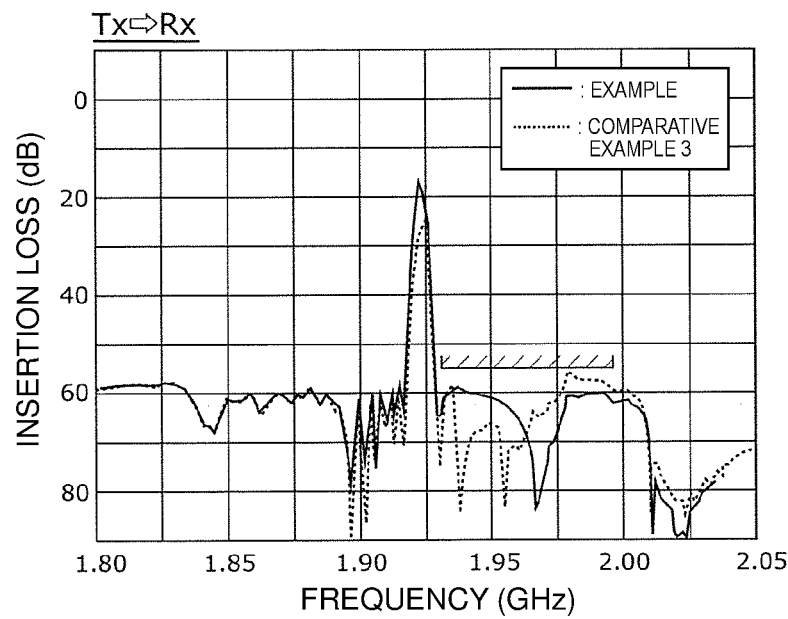
FIG. 8B is a graph that compares the isolation characteristics between a transmission input terminal and a reception output terminal according to an example of a preferred embodiment of the present invention and the comparative example 3.
Figure 8C:
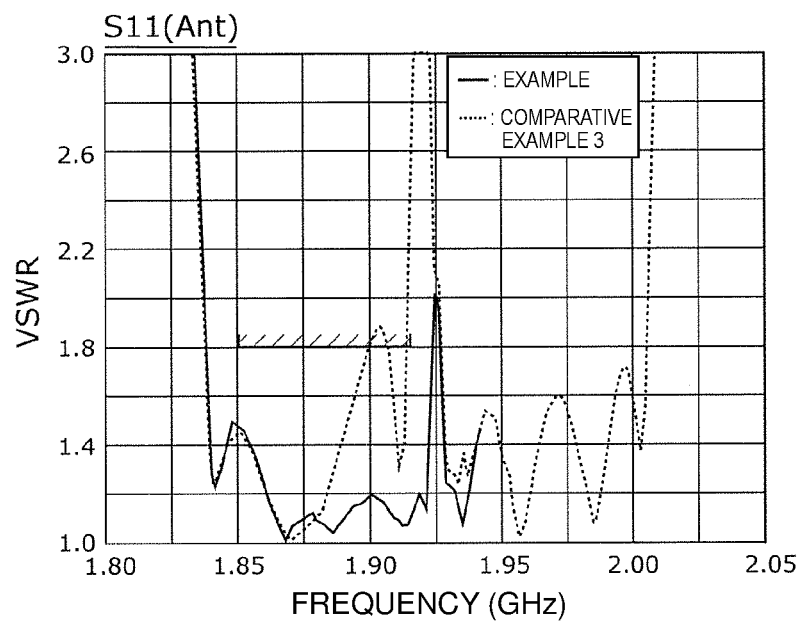
FIG. 8C is a graph that compares the values of VSWR on the antenna terminal sides of the transmission filters according to an example of a preferred embodiment of the present invention and the comparative example 3.
Figure 8D:
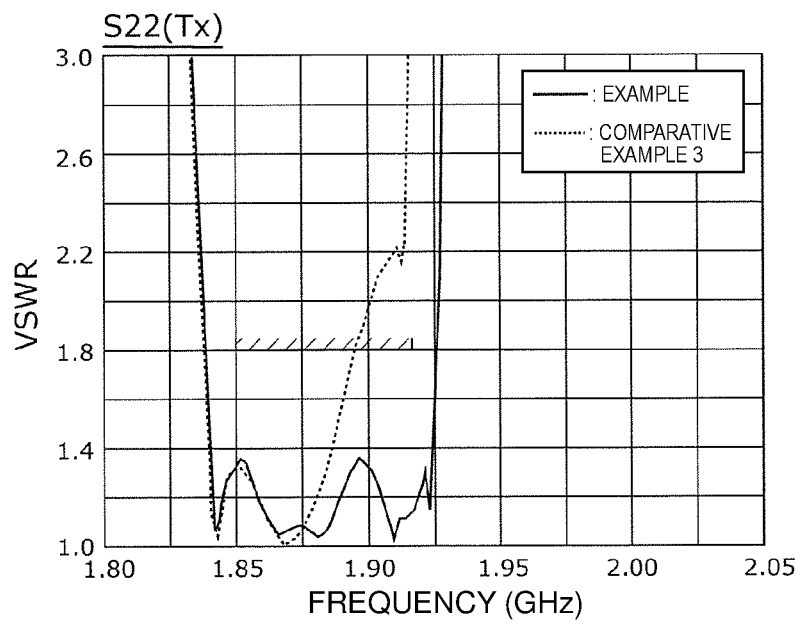
FIG. 8D is a graph that compares the values of VSWR on the transmission input terminal sides of the transmission filters according to an example of a preferred embodiment of the present invention and the comparative example 3.

FIG. 8A is a graph that illustrates the bandpass characteristics of transmission filters according to the example and a comparative example 3. In addition, FIG. 8B is a graph that illustrates the isolation characteristics between the transmission input terminal 11 and the reception output terminal 21 according to the example and the comparative example 3. Furthermore, FIG. 8C is a graph that illustrates the values of VSWR at the antenna terminal sides of the transmission filters according to the example and the comparative example 3. In addition, FIG. 8D is a graph that illustrates the values of VSWR at the transmission terminal sides of the transmission filters according to the example and the comparative example 3.

The transmission filter according to the comparative example 3 illustrated in FIGS. 8A to 8D is identical or substantially identical to the transmission filter 10 according to the example in that the transmission filter has the ladder configuration illustrated in FIG. 1, i.e., five series resonators and four parallel resonators, but differs in terms of the design parameters of the resonators. Specifically, the design parameters of the resonators of the transmission filter according to the comparative example 3 are set so as to satisfy the following relational formulas.

$$\text{fas94,fas95} > \text{fas91,fas92,fas93} \quad \text{(Formula 8)}$$

$$\Delta\text{f94},\Delta\text{f95} > \Delta\text{f91},\Delta\text{f92},\Delta\text{f93} \quad \text{(Formula 9)}$$

The series resonators of the transmission filter according to the comparative example 3 are referred to as series resonators 901, 902, 903, 904, and 905 in order from the transmission input terminal. In addition, the resonant frequencies of the series resonators 901 to 905 are respectively referred to as frs91 to frs95, and the anti-resonant frequencies of the series resonators 901 to 905 are respectively referred to as fas91 to fas95. Furthermore, frequency differences between the resonant frequencies and the anti-resonant frequencies of the series resonators 901 to 905 are respectively referred to as Δf91 to Δf95.

That is, in the transmission filter according to the comparative example 3, the anti-resonant frequencies fas91 to fas93 of the series resonators 901 to 903 including the series resonator 901 that is closest to the transmission input terminal are lower than the anti-resonant frequencies fas94 and fas95 of the series resonators 904 and 905. In addition, the frequency differences Δf91 to Δf93 of the series resonators 901 to 903 are smaller than the frequency differences Δf94 and Δf95 of the series resonators 904 and 905. That is, in the transmission filter according to the comparative example 3, Formula 8 and Formula 9 hold true.

The series resonators of the transmission filter according to the comparative example 3 satisfy the relationship of Formula 8, and consequently the anti-resonant frequencies fas91 to fas93 of the series resonators 901 to 903 are closer to the high-frequency end of the transmission band than the anti-resonant frequencies fas94 and fas95 of the series resonators 904 and 905.

On the other hand, the series resonators of the transmission filter according to the comparative example 3 satisfy the relationships of Formula 8 and Formula 9, and consequently, the resonant frequencies frs91 to frs93 of the series resonators 901 to 903 are maintained in the vicinity of the center frequency of the transmission band. However, as illustrated in FIGS. 8C and 8D, the voltage standing wave ratios (VSWR) seen from the antenna terminal 31 (FIG. 8C) and the transmission input terminal 11 (FIG. 8D) are degraded inside the transmission band. This is because Δf91 of the series resonator 901 that is closest to the transmission input terminal 11 is made smaller, and therefore, the impedance at the transmission input terminal is degraded. In other words, the impedance characteristic inside the transmission band is degraded when Δf91 of the series resonator 901 that is closest to the transmission input terminal is made smaller than Δf94 and Δf95.

Figure 9A:
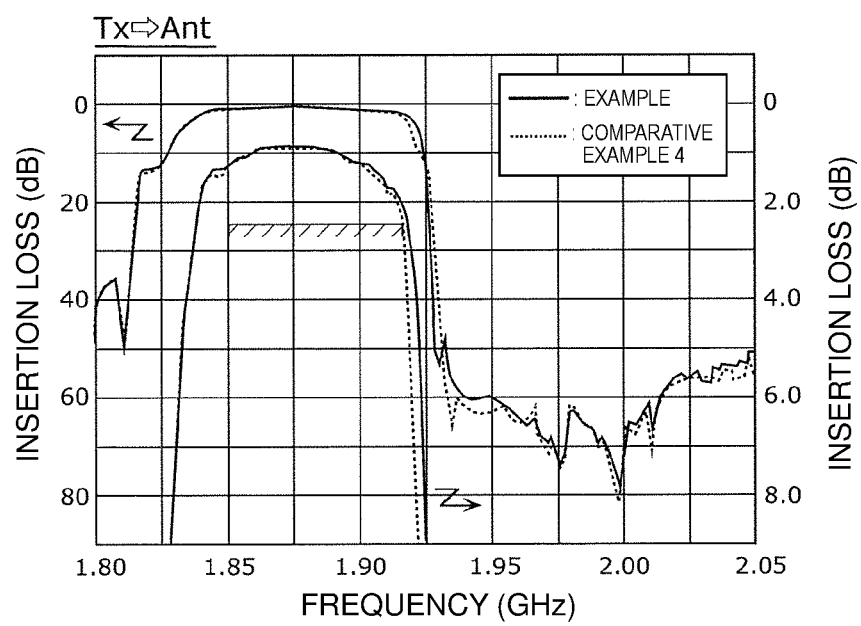
FIG. 9A is a graph that compares the bandpass characteristics of transmission filters according to an example of a preferred embodiment of the present invention and a comparative example 4.

FIG. 9A is a graph that illustrates the bandpass characteristics of transmission filters according to the example and a comparative example 4. In addition, FIG. 9B is a graph that illustrates the isolation characteristics between the transmission input terminal 11 and the reception output terminal 21 according to the example and the comparative example 4.

Figure 9B:
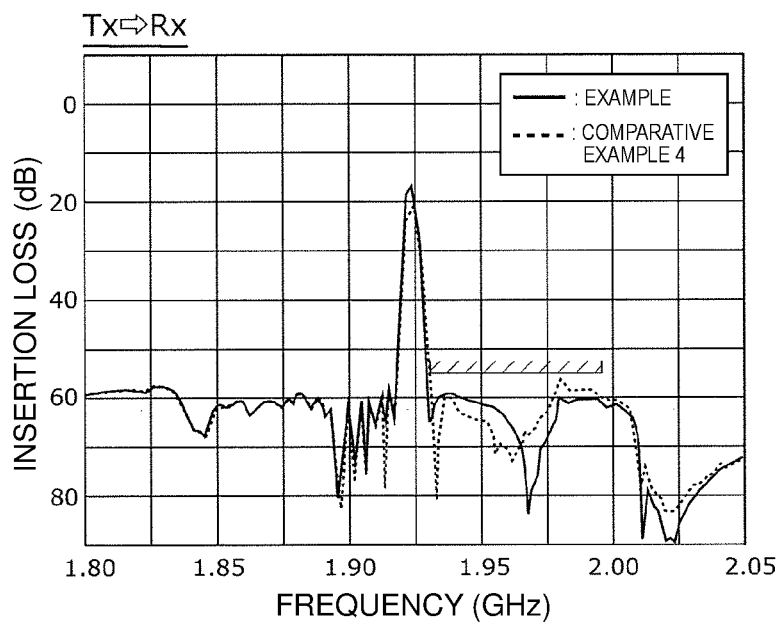
FIG. 9B is a graph that compares the isolation characteristics between the transmission input terminal and the reception output terminal according to an example of a preferred embodiment of the present invention and the comparative example 4.

The transmission filter according to the comparative example 4 illustrated in FIGS. 9A and 9B is identical or substantially identical to the transmission filter 10 according to the example in that the transmission filter has the ladder configuration illustrated in FIG. 1, i.e., five series resonators and four parallel resonators, but differs in terms of the design parameters of the resonators. Specifically, the design parameters of the resonators of the transmission filter according to the comparative example 4 are set so as to satisfy the following relational formulas.

$$fas91, fas94, fas95 > fas92, fas93 \qquad \text{(Formula 10)}$$

$$\Delta f94, \Delta f95 > \Delta f91, \Delta f92, \Delta f93 \qquad \text{(Formula 11)}$$

The reference symbols representing the series resonators, the anti-resonant frequencies, the resonant frequencies and the frequency differences of the transmission filter according to the comparative example 4 are the same or substantially the same as those of the transmission filter according to the comparative example 3.

In order to improve the impedance at the transmission input terminal in the transmission filter according to the comparative example 4 as compared with the transmission filter according to the comparative example 3, the frequency of the series resonator 901 of the comparative example 3 was made higher. That is, the anti-resonant frequency fas91 of the series resonator 901 was made higher than in the comparative example 3.

With the configuration of the series resonators according to the comparative example 4, in particular, the impedance at the transmission input terminal is able to be improved. However, as illustrated in FIGS. 9A and 9B, the steepness of the insertion loss and isolation in the transmission/reception inter-band region are degraded. In other words, with the configuration of the transmission filter according to the comparative example 4, it is not possible to obtain both the desired impedance inside the transmission band and the desired steepness at the high-frequency side of the transmission band.

Table 2 illustrates results that summarize the relationships between the anti-resonant frequencies and the frequency differences for the transmission filters according to the example and comparative examples 1 to 4.

TABLE 2

|  |  | FIRST SERIES RESONATOR | SECOND SERIES RESONATOR | THIRD SERIES RESONATOR | FOURTH SERIES RESONATOR | FIFTH SERIES RESONATOR |
| --- | --- | --- | --- | --- | --- | --- |
| EXAMPLE | ANTI-RESONANCE POINT | fas1 | >fas2 | >fas3 | >fas4 | fas5 |
|  | FREQUENCY DIFFERENCE | Δf1 | >Δf2 | >Δf3 | >Δf4 | Δf5 |
| COMPARATIVE EXAMPLE 1 | ANTI-RESONANCE POINT | fas71 | fas72 | fas73 | >fas74 | fas75 |
|  | FREQUENCY DIFFERENCE | Δf71 | Δf72 | Δf73 | Δf74 | Δf75 |
| COMPARATIVE EXAMPLE 2 | ANTI-RESONANCE POINT | fas81 | >fas82 | >fas83 | >fas84 | fas85 |
|  | FREQUENCY DIFFERENCE | Δf81 | Δf82 | Δf83 | Δf84 | Δf85 |

TABLE 2-continued

|  |  | FIRST SERIES RESONATOR | SECOND SERIES RESONATOR | THIRD SERIES RESONATOR | FOURTH SERIES RESONATOR | FIFTH SERIES RESONATOR |
|---|---|---|---|---|---|---|
| COMPARATIVE EXAMPLE 3 | ANTI-RESONANCE POINT | >fas91 | >fas92 | >fas93 | fas94 | fas95 |
|  | FREQUENCY DIFFERENCE | >Δf91 | >Δf92 | >Δf93 | Δf94 | Δf95 |
| COMPARATIVE EXAMPLE 4 | ANTI-RESONANCE POINT | fas91 | >fas92 | >fas93 | fas94 | fas95 |
|  | FREQUENCY DIFFERENCE | >Δf91 | >Δf92 | >Δf93 | Δf94 | Δf95 |

In Table 2, ">" is attached to anti-resonant frequencies fas that have been set to be lower than the anti-resonant frequencies fas of reference series resonators that are closest to the transmission input terminal and the antenna terminal. In addition, ">" is attached to frequency differences Δf that have been set to be smaller than the frequency differences Δf of the reference series resonators that are closest to the transmission input terminal and the antenna terminal.

In the comparative example 1, the desired isolation cannot be satisfied in the transmission/reception inter-band region.

In the comparative example 2, the resonant frequencies frs82 to frs84 are shifted toward the low-frequency side from the center frequency of the transmission band. Thus, voltage standing wave ratios (VSWR) seen from the antenna terminal and the transmission input terminal are degraded inside the transmission band.

In the comparative example 3, the anti-resonant frequencies fas91 to fas93 are close to the high-frequency end of the transmission band, and the resonant frequencies frs91 to frs93 are maintained in the vicinity of the center frequency of the transmission band. However, Δf91 of the series resonator 901 that is closest to the transmission input terminal has been made smaller, and therefore, the impedance at the transmission input terminal is degraded.

In the comparative example 4, in order to improve the impedance at the transmission input terminal in comparative example 3, the frequency of the series resonator 901 is made higher. Thus, although the impedance at the transmission input terminal can be improved, the steepness of the insertion loss and the isolation in the transmission/reception inter-band region are degraded.

In other words, with the transmission filters according to the comparative examples 1 to 4, when the anti-resonance points of a plurality of series resonators are brought closer to the high-frequency end of the pass band in order to improve the steepness of the bandpass characteristic at the high-frequency side of the pass band, the resonant frequencies are shifted toward the low-frequency side inside the pass band due to the frequency differences Δf becoming too large. Thus, impedance is degraded. In addition, when the anti-resonant frequency and the frequency difference Δf of the series resonator that is closest to the transmission input terminal are adjusted in order to improve the steepness of the bandpass characteristic at the high-frequency-side of the pass band, the impedance is degraded.

In contrast, in the transmission filter 10 according to an example of a preferred embodiment of the present invention, Δf2 to Δf4 are smaller than Δf1 and Δf5 while causing the anti-resonant frequencies fas2 to fas4 of the series resonators 102 to 104 other than the series resonators 101 and 105 that are closest to the transmission input terminal 11 and the antenna terminal 31 to be shifted so as to be at lower frequencies than fas1 and fas5. As a result, since the resonant frequencies frs2 to frs4 are not shifted toward the low-frequency side, the impedance characteristics inside the transmission band are able to be maintained as desired characteristics. On the other hand, the steepness of insertion loss and the isolation in the transmission/reception inter-band region $F_A$ are improved at the high-frequency side of the transmission band by causing the anti-resonant frequencies fas2 to fas4 to move closer to the high-frequency end of the transmission band. In other words, the transmission filter 10 according to this example is able to achieve high steepness of insertion loss in the frequency region between the transmission band and the adjacent reception band while maintaining the desired impedance inside the transmission band.

As described above, the transmission filter 10 according to the present preferred embodiment preferably is preferably provided with five series resonators 101 to 105, which include IDT electrodes provided on the piezoelectric substrate 50 and which are serially connected between the transmission input terminal 11 and the antenna terminal 31, and the parallel resonators 151 to 154, which include IDT electrodes provided on the piezoelectric substrate 50. In this case, the frequency differences Δf2 to Δf4 of all of the series resonators 102 to 104 other than the series resonator 101 that is connected so as to be closest to the transmission input terminal 11 and the series resonator 105 that is connected so as to be closest to the antenna terminal 31 are smaller than the frequency differences Δf1 and Δf5 of the series resonators 101 and 105, and the anti-resonant frequencies fas2 to fas4 of the series resonators 102 to 104 are lower than the anti-resonant frequencies fas1 and fas5 of the series resonators 101 and 105.

In addition, the repeating pitches λ2 to λ4 of the plurality of electrode fingers of the IDT electrodes of the series resonators 102 to 104 may preferably be larger than the repeating pitches λ1 and λ5 of the plurality of electrode fingers of the IDT electrodes of the series resonators 101 and 105.

Furthermore, the transmission filter (elastic wave filter) according to the present preferred embodiment is not limited to a configuration that includes five series resonators, and it is sufficient that the transmission filter be provided with four or more series resonators. In this case, it is sufficient that the Δf's of all of the series resonators except for a first series resonator that is connected so as to be closest to the input terminal and a second series resonator that is connected so as to be closest to the output terminal among the four or more series resonators be smaller than the Δf's of the first series resonator and the second series resonator and that the anti-resonant frequencies fas of all of the series resonators except for the first series resonator and the second series resonator be lower than the anti-resonant frequencies fas of the first series resonator and the second series resonator. With this configuration, the same or substantially the same effect is achieve as with the transmission filter 10.

Furthermore, a multiplexer may be provided that includes a plurality of band pass filters that selectively allow prescribed frequency bands to pass therethrough and that thus splits an input signal. The frequency bands that are allowed to pass through the plurality of band pass filters differ from one another, first ends of the plurality of band pass filters are connected to a common terminal, and at least one band pass filter other than the band pass filter having the highest frequency band among the plurality of band pass filters may be a band pass filter having the characteristics of the transmission filter 10 according to an example of a preferred embodiment of the present invention.

In addition, a duplexer may be provided in which the filter through which the lower frequency band passes out of the transmission filter and the reception filter is a band pass filter having the characteristics of the transmission filter 10 according to an example of a preferred embodiment of the present invention.

Next, a high-frequency front end circuit 60 that includes the duplexer 1, and a communication device 70 are described.

Figure 10:
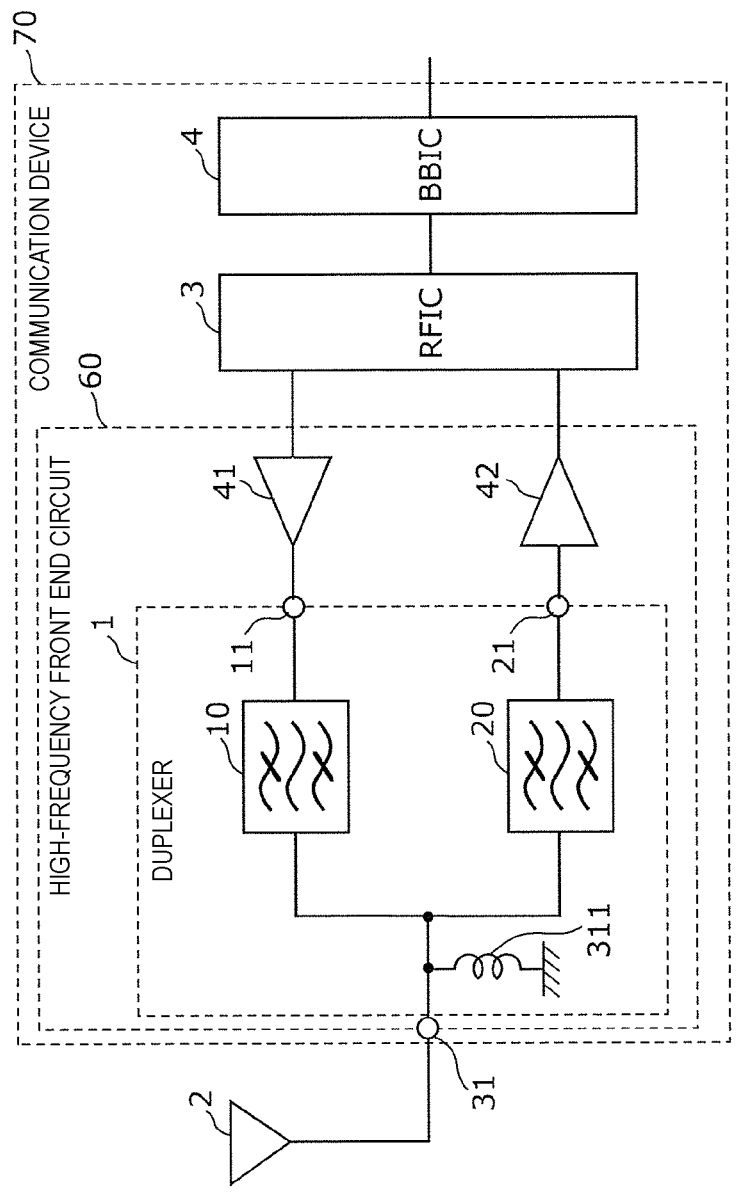
FIG. 10 is a circuit configuration diagram illustrating a high-frequency front end circuit that includes the duplexer according to an example of a preferred embodiment of the present invention, and a communication device.

FIG. 10 is a circuit configuration diagram illustrating high-frequency front end circuit 60, which includes the duplexer 1 according to an example of a preferred embodiment of the present invention, and the communication device 70. The figure illustrates the high-frequency front end circuit 60, an antenna element 2, an RF signal processing circuit (RFIC) 3, and a baseband signal processing circuit (BBIC) 4.

The high-frequency front end circuit 60, the RF signal processing circuit 3, and the baseband signal processing circuit 4 define the communication device 70.

The high-frequency front end circuit 60 includes the duplexer 1, a power amplifier circuit 41, and a low-noise amplifier circuit 42.

The power amplifier circuit 41 is a transmission amplification circuit that amplifies a high-frequency transmission signal output from the RF signal processing circuit 3, and outputs the amplified high-frequency transmission signal to the antenna element 2 via the transmission input terminal 11, the transmission filter 10, and the antenna terminal 31.

The low-noise amplifier circuit 42 is a reception amplification circuit that amplifies a high-frequency signal input thereto via the antenna element 2, the antenna terminal 31, and the reception filter 20, and outputs the amplified high-frequency signal to the RF signal processing circuit 3.

The RF signal processing circuit 3 subjects a high-frequency reception signal input thereto along a reception signal path from the antenna element 2 to signal processing using down conversion and so forth, and outputs the reception signal generated through the signal processing to the baseband signal processing circuit 4. In addition, the RF signal processing circuit 3 subjects a transmission signal input thereto from the baseband signal processing circuit 4 to signal processing using up conversion and so forth, and outputs the high-frequency transmission signal generated through the signal processing to the power amplifier circuit 41. The RF signal processing circuit 3 is a radio frequency integrated circuit (RFIC), for example.

The signal processed by the baseband signal processing circuit 4 is preferably used as an image signal in image display or as an audio signal in a telephone call, for example.

The high-frequency front end circuit 60 may include other circuit elements between the duplexer 1, the power amplifier circuit 41 and the low-noise amplifier circuit 42.

With this configuration, a high-frequency front end circuit and a communication device may preferably be provided that include an elastic wave filter that has high steepness in the bandpass characteristic outside a pass band while maintaining a desired impedance inside the pass band even for a frequency standard that has wide pass bands and a narrow interval between adjacent bands.

In the above description, a duplexer is described as an example, but preferred embodiments of the present invention may also be applied to a triplexer in which three filters are commonly connected to an antenna terminal, and a quadplexer in which four filters are commonly connected to an antenna terminal, for example. In other words, it is sufficient for the high-frequency front end circuit and the communication device to include two or more filters.

In addition, the high-frequency front end circuit and the communication device are not limited to a configuration that includes both of a transmission filter and a reception filter, and the high-frequency front end circuit and the communication device may instead have a configuration that includes only a transmission filter or only a reception filter.

Furthermore, the communication device 70 does not necessarily include the baseband signal processing circuit 4 depending on the processing method used for high-frequency signals.

Surface acoustic wave filters, multiplexers, and duplexers according to preferred embodiments of the present invention have been described above using examples, but the present invention is not limited to the examples. For example, the following modifications of the above-described examples may be included in the present invention.

For example, 50° Y-cut X-propagation LiTaO$_3$ single crystal is preferably used as the piezoelectric layer 53 of the substrate 50 in the example, but the cut angle of the single crystal material is not limited to this example. That is, the cut angle of the piezoelectric layer of the surface acoustic wave filter that satisfies Formula 1 and Formula 2 when LiTaO$_3$ single crystal is used as the piezoelectric layer is not limited to 50° Y. The same or similar effect is able to be achieved with a surface acoustic wave filter using a LiTaO$_3$ piezoelectric layer having a different cut angle. In addition, the piezoelectric layer may be made of another type of piezoelectric single crystal, such as LiNbO$_3$, for example. Furthermore, in the present invention, as long as the piezoelectric layer 53 is included, the substrate 50 may have a structure in which a piezoelectric layer is stacked on a support substrate other than the entire substrate 50 being made of a piezoelectric layer.

In addition, in the above-described preferred embodiments, surface acoustic wave filters including IDT electrodes are exemplified, but elastic wave filters according to preferred embodiments of the present invention are not limited to surface acoustic wave filters, and may instead be elastic wave filters that use boundary acoustic waves or bulk acoustic waves (BAW) that includes series resonators and parallel resonators. With this configuration, the same or similar effect as that produced by the surface acoustic wave filters according to the above-described preferred embodiments is provided.

In addition, although the transmission filter 10 is described as an element of a preferred embodiment of the present invention, the elements of the present invention may also be used for the reception filter 20. In such a case, the reception filter 20 preferably includes four or more series resonators that are connected in series with each other between an input terminal and an output terminal, and parallel resonators that are each connected between any of connection nodes between the input terminal, the output terminal, and the four or more series resonators, and a reference terminal. Frequency differences that are the differences between the anti-resonant frequencies and the resonant frequencies of all of the series resonators except for a first series resonator that is connected so as to be closest to the input terminal and a second series resonator that is connected so as to be closest to the output terminal among the four or more series resonators are smaller than the frequency differences between the anti-resonant frequencies and the resonant frequencies of the first series resonator and the second series resonator. The anti-resonant frequencies of all the series resonators except for the first series resonator and the second series resonator are lower than the anti-resonant frequencies of the first series resonator and the second series resonator.

Preferred embodiments of the present invention may be widely used in communication devices, such as cellular phones, for example, as elastic wave filters, multiplexers and duplexers that are able to be applied to frequency standards having wide band widths and narrow intervals between the bands.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter comprising:
   four or more series resonators that are connected in series with each other between an input terminal and an output terminal;
   a parallel resonator that is connected between any of connection nodes between the input terminal, the output terminal and the four or more series resonators, and a reference terminal;
   a first inductance element that is connected between the input terminal and a first series resonator that is connected so as to be closest to the input terminal; and
   a second inductance element that is connected between the parallel resonator and the reference terminal; wherein
   frequency differences that are differences between anti-resonant frequencies and resonant frequencies of all of the series resonators except for the first series resonator that is connected so as to be closest to the input terminal and a second series resonator that is connected so as to be closest to the output terminal among the four or more series resonators are smaller than frequency differences between the anti-resonant frequencies and the resonant frequencies of the first series resonator and the second series resonator, and the anti-resonant frequencies of all of the series resonators except for the first series resonator and the second series resonator are lower than the anti-resonant frequencies of the first series resonator and the second series resonator; and
   each of the four or more series resonators is a surface acoustic wave resonator.

2. The elastic wave filter according to claim 1, wherein the four or more series resonators and the parallel resonator each include an IDT electrode that is provided on a substrate including a piezoelectric layer; and
   repeating pitches of a plurality of electrode fingers of the IDT electrodes of all of the series resonators except for the first series resonator and the second series resonator are larger than repeating pitches of a plurality of electrode fingers of the IDT electrodes of the first series resonator and the second series resonator.

3. The elastic wave filter according to claim 2, wherein the substrate including the piezoelectric layer includes:
   the piezoelectric layer including the IDT electrodes provided on one surface thereof;
   a high-acoustic-velocity support substrate in which an acoustic velocity of a bulk wave that propagates therethrough is higher than an acoustic velocity of an elastic wave that propagates along the piezoelectric layer; and
   a low-acoustic-velocity film between the high-acoustic-velocity support substrate and the piezoelectric layer, and in which an acoustic velocity of a bulk wave that propagates therethrough is lower than an acoustic velocity of an elastic wave that propagates along the piezoelectric layer.

4. The elastic wave filter according to claim 1, wherein the four or more series resonators include five series resonators; and
   frequency differences that are differences between the anti-resonant frequencies and the resonant frequencies of three series resonators other than the first series resonator and the second series resonator among the five series resonators are smaller than the frequency differences between the anti-resonant frequencies and the resonant frequencies of the first series resonator and the second series resonator, and the anti-resonant frequencies of the three series resonators other than the first series resonator and the second series resonator are lower than the anti-resonant frequencies of the first series resonator and the second series resonator.

5. A multiplexer comprising:
   a plurality of band pass filters that selectively allow prescribed frequency bands to pass therethrough so as to split an input signal; wherein
   the frequency bands that are allowed to pass through the plurality of band pass filters are different from one another, and first ends of the plurality of band pass filters are connected to a common terminal; and
   at least one band pass filter other than a band pass filter having a highest frequency band among the plurality of band pass filters is the elastic wave filter according to claim 1.

6. The multiplexer according to claim 5, wherein the four or more series resonators and the parallel resonator each include an IDT electrode that is provided on a substrate including a piezoelectric layer; and
   repeating pitches of a plurality of electrode fingers of the IDT electrodes of all of the series resonators except for the first series resonator and the second series resonator are larger than repeating pitches of a plurality of electrode fingers of the IDT electrodes of the first series resonator and the second series resonator.

7. The multiplexer according to claim 6, wherein the substrate including the piezoelectric layer includes:
   the piezoelectric layer including the IDT electrodes provided on one surface thereof;
   a high-acoustic-velocity support substrate in which an acoustic velocity of a bulk wave that propagates therethrough is higher than an acoustic velocity of an elastic wave that propagates along the piezoelectric layer; and a low-acoustic-velocity film between the high-acoustic-velocity support substrate and the piezoelectric layer, and in which an acoustic velocity of a bulk wave that propagates therethrough is lower than an acoustic velocity of an elastic wave that propagates along the piezoelectric layer.

8. The multiplexer according to claim 5, wherein the four or more series resonators include five series resonators; and frequency differences that are differences between the anti-resonant frequencies and the resonant frequencies of three series resonators other than the first series resonator and the second series resonator among the five series resonators are smaller than the frequency differences between the anti-resonant frequencies and the resonant frequencies of the first series resonator and the second series resonator, and the anti-resonant frequencies of the three series resonators other than the first series resonator and the second series resonator are lower than the anti-resonant frequencies of the first series resonator and the second series resonator.

9. A high-frequency front end circuit comprising:
the multiplexer according to claim 5; and
an amplification circuit that is connected to the multiplexer.

10. A communication device comprising:
an RF signal processing circuit that processes a high-frequency signal transmitted or received by an antenna element; and the high-frequency front end circuit according to claim 9, which transmits the high-frequency signal between the antenna element and the RF signal processing circuit.

11. A duplexer comprising:
a transmission filter and a reception filter, in which one end of the transmission filter and one end of the reception filter are commonly connected to an antenna terminal; wherein the filter through which a lower frequency band is allowed to pass out of the transmission filter and the reception filter is the elastic wave filter according to claim 1.

12. The duplexer according to claim 11, wherein the four or more series resonators and the parallel resonator each include an IDT electrode that is provided on a substrate including a piezoelectric layer; and repeating pitches of a plurality of electrode fingers of the IDT electrodes of all of the series resonators except for the first series resonator and the second series resonator are larger than repeating pitches of a plurality of electrode fingers of the IDT electrodes of the first series resonator and the second series resonator.

13. The duplexer according to claim 12, wherein the substrate including the piezoelectric layer includes:
the piezoelectric layer including the IDT electrodes provided on one surface thereof;
a high-acoustic-velocity support substrate in which an acoustic velocity of a bulk wave that propagates therethrough is higher than an acoustic velocity of an elastic wave that propagates along the piezoelectric layer; and
a low-acoustic-velocity film between the high-acoustic-velocity support substrate and the piezoelectric layer, and in which an acoustic velocity of a bulk wave that propagates therethrough is lower than an acoustic velocity of an elastic wave that propagates along the piezoelectric layer.

14. The duplexer according to claim 11, wherein the four or more series resonators include five series resonators; and frequency differences that are differences between the anti-resonant frequencies and the resonant frequencies of three series resonators other than the first series resonator and the second series resonator among the five series resonators are smaller than the frequency differences between the anti-resonant frequencies and the resonant frequencies of the first series resonator and the second series resonator, and the anti-resonant frequencies of the three series resonators other than the first series resonator and the second series resonator are lower than the anti-resonant frequencies of the first series resonator and the second series resonator.

15. A high-frequency front end circuit comprising:
the duplexer according to claim 11; and
an amplification circuit that is connected to the duplexer.

16. A communication device comprising:
an RF signal processing circuit that processes a high-frequency signal transmitted or received by an antenna element; and the high-frequency front end circuit according to claim 15, which transmits the high-frequency signal between the antenna element and the RF signal processing circuit.

17. A high-frequency front end circuit comprising:
the elastic wave filter according to claim 1; and
an amplification circuit that is connected to the elastic wave filter.

18. A communication device comprising:
an RF signal processing circuit that processes a high-frequency signal transmitted or received by an antenna element; and the high-frequency front end circuit according to claim 17, which transmits the high-frequency signal between the antenna element and the RF signal processing circuit.

* * * * *